United States Patent
Tanaka et al.

(10) Patent No.: US 9,053,985 B2
(45) Date of Patent: Jun. 9, 2015

(54) SEMICONDUCTOR DEVICE HAVING A CONTACT PATTERN ELECTRICALLY CONNECTING AT LEAST THREE CONDUCTIVE LAYERS

(75) Inventors: Tsutomu Tanaka, Kanagawa (JP); Yasuhiro Yamada, Kanagawa (JP); Hirohisa Takeda, Aichi (JP)

(73) Assignee: Sony Corporation, Tokyo (JP)

( * ) Notice: Subject to any disclaimer, the term of this patent is extended or adjusted under 35 U.S.C. 154(b) by 569 days.

(21) Appl. No.: 12/183,119

(22) Filed: Jul. 31, 2008

(65) Prior Publication Data

US 2009/0032955 A1 Feb. 5, 2009

(30) Foreign Application Priority Data

Aug. 3, 2007 (JP) ................. 2007-202867

(51) Int. Cl.
*H01L 23/528* (2006.01)
*H01L 27/12* (2006.01)
*H01L 23/522* (2006.01)
*H01L 21/768* (2006.01)

(52) U.S. Cl.
CPC ........ *H01L 27/124* (2013.01); *H01L 21/76805* (2013.01); *H01L 23/5226* (2013.01)

(58) Field of Classification Search
CPC ................. H01L 21/76805; H01L 23/5226; H01L 27/124
USPC ............... 257/758, 774, 775, E23.145, 0.151, 257/0.175
See application file for complete search history.

(56) References Cited

U.S. PATENT DOCUMENTS

| | | | | |
|---|---|---|---|---|
| 4,966,864 A * | 10/1990 | Pfiester | ............................ | 438/533 |
| 5,223,456 A * | 6/1993 | Malwah | ......................... | 438/586 |
| 5,227,013 A * | 7/1993 | Kumar | ............................... | 216/18 |
| 5,262,352 A * | 11/1993 | Woo et al. | ....................... | 438/625 |
| 5,824,579 A * | 10/1998 | Subramanian et al. | ......... | 438/238 |
| 6,022,804 A * | 2/2000 | Yano et al. | ...................... | 438/675 |
| 6,313,029 B1 * | 11/2001 | Kim | ................................ | 438/637 |
| 6,444,484 B1 * | 9/2002 | Ahn | ................................. | 438/30 |
| 6,664,639 B2 * | 12/2003 | Cleeves | .......................... | 257/774 |
| 2007/0170486 A1 * | 7/2007 | Park | ............................... | 257/306 |

FOREIGN PATENT DOCUMENTS

| | | |
|---|---|---|
| JP | 02-189953 | 7/1990 |
| JP | 08-204002 | 8/1996 |
| JP | 11-340322 | 12/1999 |
| JP | 2000-267595 | 9/2000 |
| JP | 2000-269646 | 9/2000 |
| JP | 2000-352712 | 12/2000 |
| JP | 2000-357735 | 12/2000 |
| JP | 2002-176179 | 6/2002 |

OTHER PUBLICATIONS

Chinese Office Action issued Feb. 13, 2014 in corresponding Chinese Patent Application No. 200810135129.8.

* cited by examiner

*Primary Examiner* — Anh Mai
(74) *Attorney, Agent, or Firm* — K&L Gates LLP

(57) ABSTRACT

A semiconductor device including n, where notation n denotes a positive integer at least equal to three, conductive layers created as stacked layers on a substrate and connected to each other through a contact pattern, a manufacturing method thereof and a display apparatus thereof are provided.

5 Claims, 13 Drawing Sheets

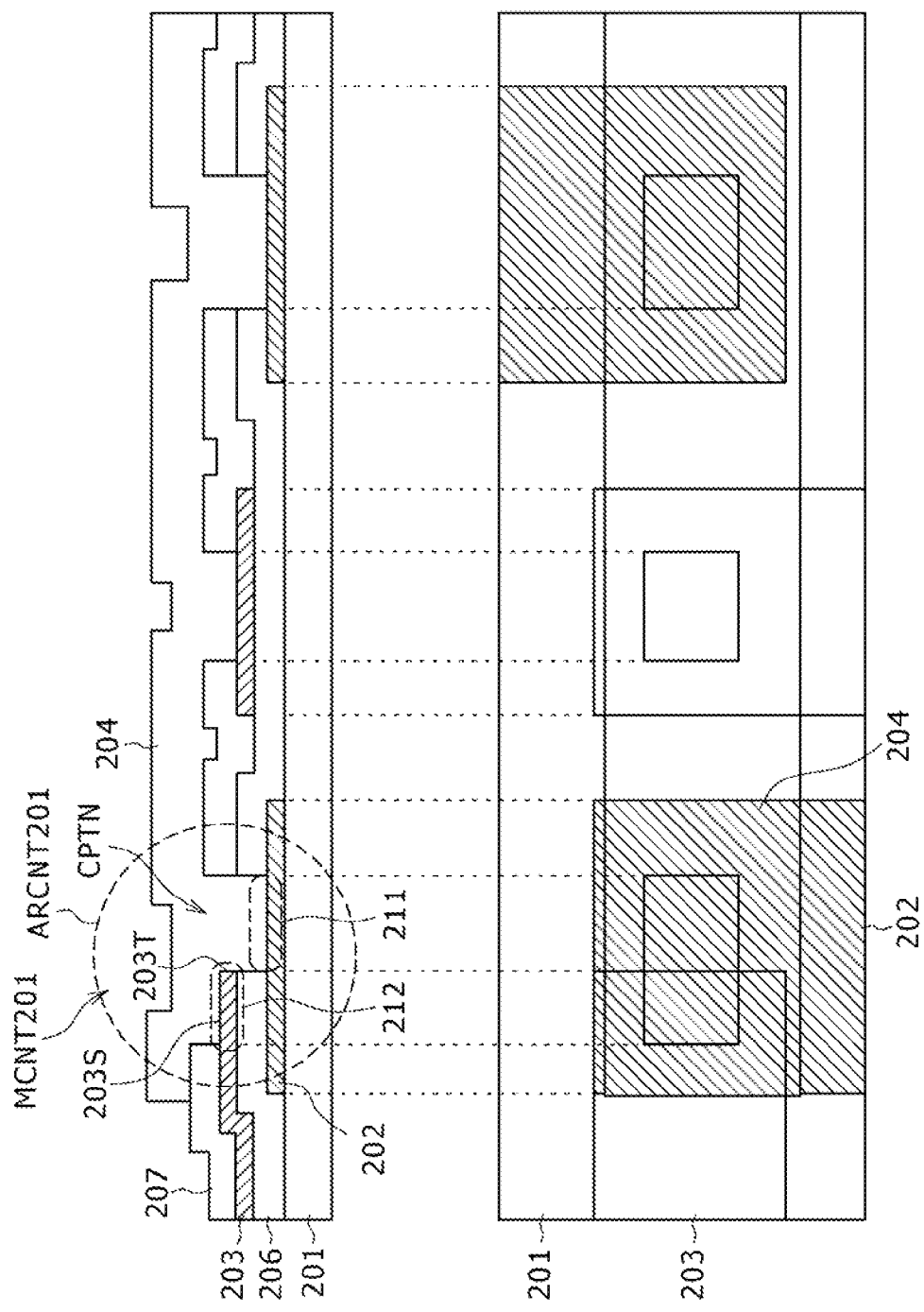

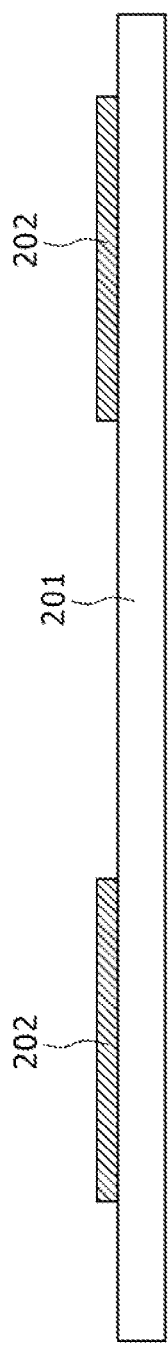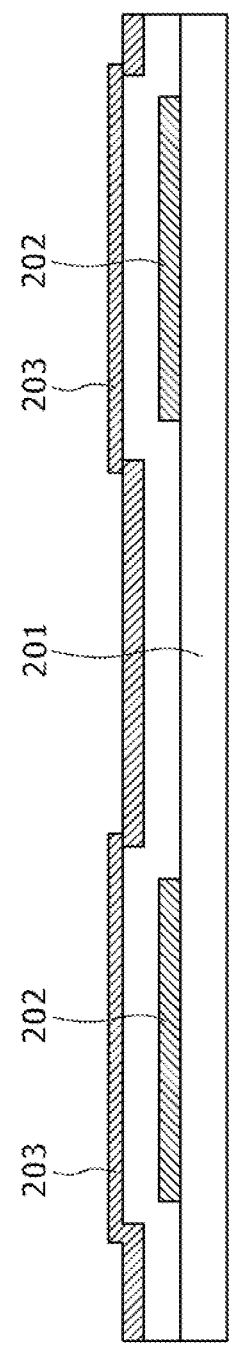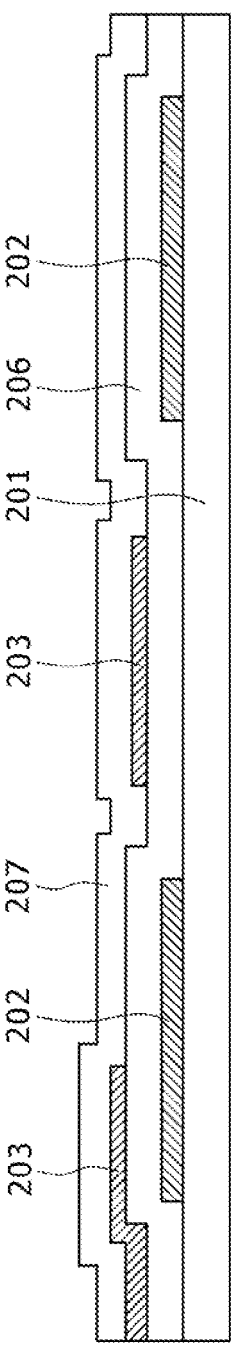

SEMICONDUCTOR DEVICE HAVING A CONTACT PATTERN ELECTRICALLY CONNECTING AT LEAST THREE CONDUCTIVE LAYERS

CROSS REFERENCES TO RELATED APPLICATIONS

The present application claims priority to Japanese Patent Application JP 2007-202867 filed in the Japan Patent Office on Aug. 3, 2007, the entire contents of which being incorporated herein by reference.

BACKGROUND

The present application relates to a semiconductor device having a contact pattern used for connecting n (where notation n denotes a positive integer at least equal to three) conductive layers to each other, a method for manufacturing the semiconductor device and display apparatus to which the semiconductor device can be applied. Examples of the display apparatus are a liquid-crystal display apparatus and an organic EL (electro luminescence) display apparatus.

In recent years, the popularization of portable terminals such as hand-held phones and PDAs (Personal Digital Assistants) is amazing. The portable terminals are being rapidly popularized by, among others, the availability of the liquid-crystal display apparatus each employable in the portable terminal as an output display section. This is because, in principle, the liquid-crystal display apparatus has a characteristic of requiring no driving power. That is to say, the liquid-crystal display apparatus is a display apparatus having small power consumption.

The contemporary active-matrix display apparatus making use of polysilicon TFTs (Thin Film Transistors) as pixel switching devices has a tendency to integrate a pixel display area section composed of pixels arranged in the form of a matrix and digital interface driving circuits into a single unit on the same substrate.

To put it in detail, in this display apparatus integrating the digital interface driving circuits with the pixel display area section into a single unit, a horizontal driving system and a vertical driving system which compose the digital interface driving circuits are provided in the peripheral parts of an effective display portion of the pixel display area section. The driving systems making use of polysilicon TFTs are integrated with the pixel display area section into a single unit on the same substrate.

In addition, in recent years, the liquid-crystal display apparatus and the organic EL display apparatus which are employed in hand-held phones or the like are desired to have a small size and a small weight even though the display apparatus itself has a high-resolution and large screen of the three-inch WVGA (Wide Video Graphics Array) class.

Some of the liquid-crystal display apparatus and the organic EL display apparatus are display apparatus each making use of the amorphous silicon (a-Si) material used for making a semiconductor layer. In the case of such a display apparatus, it is necessary to implement the driving circuits as silicon (Si) chips in the peripheral parts of an effective display portion of the pixel display area section employed in the display apparatus. In consequence, it is inconvenient to reduce the size of the pixel display area section employed in the display apparatus and/or narrow an area occupied by the peripheral parts of the effective display portion of the pixel display area section.

As a method for solving the above problem, there is also provided a method for producing the display apparatus described above. In accordance with this method, the driving circuits are created in a process carried out at the same time as the process to form pixel transistors on a glass substrate. The driving circuits are created on the same glass substrate by making use of a semiconductor layer having a mobility greater than that of an amorphous silicon film. Examples of such a semiconductor layer are a low-temperature polysilicon film, a microcrystal silicon film and an oxide semiconductor film.

SUMMARY

Even if the method described above is adopted, however, it becomes more difficult to narrow an area occupied by the peripheral parts composing the driving circuits as the size of the driving circuits increases.

Parameters used for determining the degree of integration of the peripheral driving circuits in addressing the problems described above include a contact portion for connecting wiring layers (also each referred to as a conductive layer) to each other. The larger the number of wiring layers necessary for implementing a large circuit scale, the larger the number of such contact portions.

FIG. 1 is a diagram showing a top view of a typical contact creation area in which contact portions are created by adoption of an ordinary method. In FIG. 1, notations EL1 and EL2 each denote an electrode whereas notations ARCNT1 and ARCNT2 each denote a contact area. Notation C denotes the size of a minimum contact hole whereas notation M denotes a necessary margin set by considering an alignment shift between layers.

Let us assume that the minimum contact area in the typical contact creation area shown in FIG. 1 is used for connecting two layers by adoption of an ordinary method. In this case, a design value of a minimum area desired for the contact is represented by an expression of $((C+2 \times M)^2) \times 2$ considering the size C of the minimum pattern determined by the resolution of the exposure apparatus and the margin M of alignment between layers. This means that an area of $(C+2 \times M) \times (2 \times M)$ between the contact areas ARCNT1 and ARCNT2 is excessive, hence, giving rise to a drawback in the effort to reduce the size of the display apparatus and/or narrow an area occupied by the peripheral parts.

Japanese Patent Laid-Open No. 2000-267595 discloses a fabrication method for connecting a scan line and a signal line to pixel electrodes.

FIG. 2 is a diagram showing a top view of a typical contact creation area for connecting a scan line and a signal line to pixel electrodes by adoption of a fabrication method.

The typical contact creation area shown in FIG. 2 includes a portion in which a first contact area ARCNT11 overlaps a second contact area ARCNT12.

Even by adoption of this method, however, $(C+4 \times M)^2$ is necessary and, hence, a large area is desired.

An embodiment provides a semiconductor device allowing implementation of a contact structure usable for connecting wires on three or more layers to each other with the highest degree of efficiency by making use of a minimum area, provides a method for manufacturing the semiconductor device and provides display apparatus to which the semiconductor device can be applied.

In accordance with an embodiment, there is provided a semiconductor device including n (where notation n denotes a positive integer at least equal to three) conductive layers created as stacked layers on a substrate and connected to each other through a contact pattern. In the semiconductor device: a main contact area in which the contact pattern is created includes (n−1) connection areas used respectively for connecting (n−1) conductive layers, which are included in the n conductive layers but exclude the outermost conductive layer serving as the nth conductive layer of the n conductive layers, to the nth conductive layer; every two adjacent conductive layers of the (n−1) conductive layers conceptually form a conductive-layer pair consisting of the two adjacent conductive layers which are referred to respectively as pair first and second conductive layers of the conductive-layer pair; every pair second conductive layer provided at a location geometrically displayed away from the pair first conductive layer pertaining to the same conductive-layer pair as the pair second conductive layer in the stacking direction of a lamination process to pile up the (n−1) conductive layers on the substrate is created so that the end part of the pair second conductive layer faces a portion of the edge of the contact pattern; and the (n−1) conductive layers are connected electrically to each other by the nth conductive layer.

In accordance with another embodiment, there is provided a semiconductor device including n (where notation n denotes a positive integer at least equal to three) conductive layers created as stacked layers on a substrate and connected to each other through a contact hole. In the semiconductor device: every two adjacent ones of (n−1) individual conductive layers, which are included in the n conductive layers but exclude the outermost conductive layer serving as the nth conductive layer of the n conductive layers, conceptually form a conductive-layer pair; in each individual one of the conductive-layer pairs, the individual conductive layer provided at a location geometrically displaced in a direction opposite to the stacking direction of a lamination process to pile up the conductive layers on the substrate serves as a pair first conductive layer of the individual conductive-layer pair whereas the individual conductive layer provided at a location geometrically displaced in the stacking direction of the lamination process serves as a pair second conductive layer of the individual conductive-layer pair: a main contact area in which the contact hole is created includes (n−2) sub-contact areas each allocated to an individual one of the conductive-layer pairs as a sub-contact area for connection of the pair first conductive layer of the individual conductive-layer pair to the pair second conductive layer of the individual conductive-layer pair: the contact hole described includes a first contact hole created in the main contact area as a contact hole having a diameter stretched over an exposed area of each of the (n−1) conductive layers and includes (n−2) second contact holes each created in a particular one of the (n−2) sub-contact areas as a contact hole connected to the first contact hole and extended to the pair first conductive layer of a conductive-layer pair to which the particular sub-contact area is allocated; in each specific one of the sub-contact areas, the pair second conductive layer connected in the specific sub-contact area is created so that the upper surface of the pair second conductive layer faces the first contact hole whereas the end part of the pair second conductive layer faces the second contact hole created in the specific sub-contact area; and the outermost conductive layer serving as the nth conductive layer of the n conductive layers is created, starting from the pair first conductive layers each located inside one of the second contact holes each created in one of the sub-contact areas and ending at the outermost surface of the semiconductor device, and is connected to the end parts of the pair second conductive layers as well as the upper surfaces of the pair second conductive layers in the first contact hole.

It is nice to create an interlayer insulation film between any two adjacent conductive layers included in the n conductive layers as conductive layers to be connected to each other and make the thickness of the interlayer insulation film smaller than the thickness of the nth conductive layer.

In accordance with yet another embodiment, there is provided a method for manufacturing a semiconductor device including n (where notation n denotes a positive integer at least equal to three) conductive layers created as stacked layers on a substrate and connected to each other through a contact pattern. The method includes: a process of piling up (n−1) conductive layers, which are included in the n conductive layers and exclude the outermost conductive layer serving as the nth conductive layer of the n conductive layers, on the substrate by introducing an interlayer insulation film between any adjacent two of the conductive layers; a process of continuously etching each of the interlayer insulation films in order to remove portions of each of the interlayer insulation films so as to form the contact pattern including the (n−1) conductive layers; and a process of creating the nth conductive layer so as to form a pattern covering at least a portion of each of the (n−1) conductive layers connected to each other through the contact pattern.

In accordance with still yet another embodiment, there is provided a method for manufacturing a semiconductor device. The method includes: a process of creating a first conductive layer on a substrate; a process of creating a first insulation film on the first conductive layer; a process of creating a second conductive layer on the first insulation film; a process of creating a second insulation film on the second conductive layer; a process of continuously etching the first and second insulation films in order to remove portions of the first and second insulation films so as to form a contact pattern including the first and second conductive layers; and a process of creating a third conductive layer so as to form a pattern covering at least a portion of each of the first and pair second conductive layers connected to each other through the contact pattern.

In accordance with an embodiment, there is provided a display apparatus wherein: a display section composed of pixels arranged in the form of a matrix is integrated with peripheral circuits created in peripheral parts of the display section by using a semiconductor device to form a single unit; the semiconductor device includes n (where notation n denotes a positive integer at least equal to three) conductive layers created as stacked layers on a substrate and connected to each other through a contact pattern; a main contact area in which the contact pattern is created includes (n−1) connection areas used respectively for connecting (n−1) conductive layers, which are included in the n conductive layers but exclude the outermost conductive layer serving as the nth conductive layer of the n conductive layers, to the nth conductive layer; every two adjacent conductive layers of the (n−1) conductive layers conceptually form a conductive-layer pair consisting of the two adjacent conductive layers which are referred to respectively as pair first and second conductive layers of the conductive-layer pair: every pair second conductive layer provided at a location geometrically displayed away from the pair first conductive layer pertaining to the same conductive-layer pair as the pair second conductive layer in the stacking direction of a lamination process to pile up the (n−1) conductive layers on the substrate is created so that the end part of the pair second conductive layer faces a portion of the edge of the contact pattern; and the (n−1) conductive layers are connected electrically to each other by the nth conductive layer.

In accordance with an embodiment, every two adjacent conductive layers of (n−1) conductive layers excluding the outermost conductive layer serving as the nth conductive layer of the n conductive layer conceptually form a conductive-layer pair consisting of these two adjacent conductive layers, which are referred to respectively as the pair first and second conductive layers of the conductive-layer pair. Every pair second conductive layer provided at a location geometrically displayed away from a pair first conductive layer pertaining to the same conductive-layer pair as the pair second conductive layer in the stacking direction of a lamination process to pile up the (n−1) conductive layers on the substrate is created so that the end part of the pair second conductive layer faces a portion of the edge of the contact pattern, and the (n−1) conductive layers are connected electrically to each other by the nth conductive layer.

In this case, interlayer contacts between three or more conductive layers can be established in the same contact hole so that the conductive layers can be connected to each other with the highest degree of efficiency by making use of a minimum area.

In accordance with an embodiment, it is possible to provide a semiconductor device allowing implementation of a contact structure usable for connecting wires on three or more layers to each other with the highest degree of efficiency by making use of a minimum area.

As a result, it is possible to implement a display apparatus having driving circuits integrated with a display section to form a single unit as an apparatus capable of keeping up with a higher resolution screen and/or peripheral parts occupying a narrow area. In the following description, a display apparatus having driving circuits integrated with a display section to form a single unit is referred to simply as a built-in driving-circuit display apparatus.

Additional features and advantages are described herein, and will be apparent from the following Detailed Description and the figures.

BRIEF DESCRIPTION OF THE FIGURES

FIG. 6A is a diagram showing a cross section of the contact structure;

FIG. 6B is a diagram showing a top view of the contact structure;

FIG. 13A is a diagram to be referred to in description of a process of creating a first conductive layer on a substrate;

FIG. 13B is a diagram to be referred to in description of a process of creating a second conductive layer on a first interlayer insulation film;

FIG. 13C is a diagram to be referred to in description of a process of creating a second interlayer insulation film on the second conductive layer;

DETAILED DESCRIPTION

The present application is explained in detail and referring to figures as follows according to an embodiment.

Figure 3:
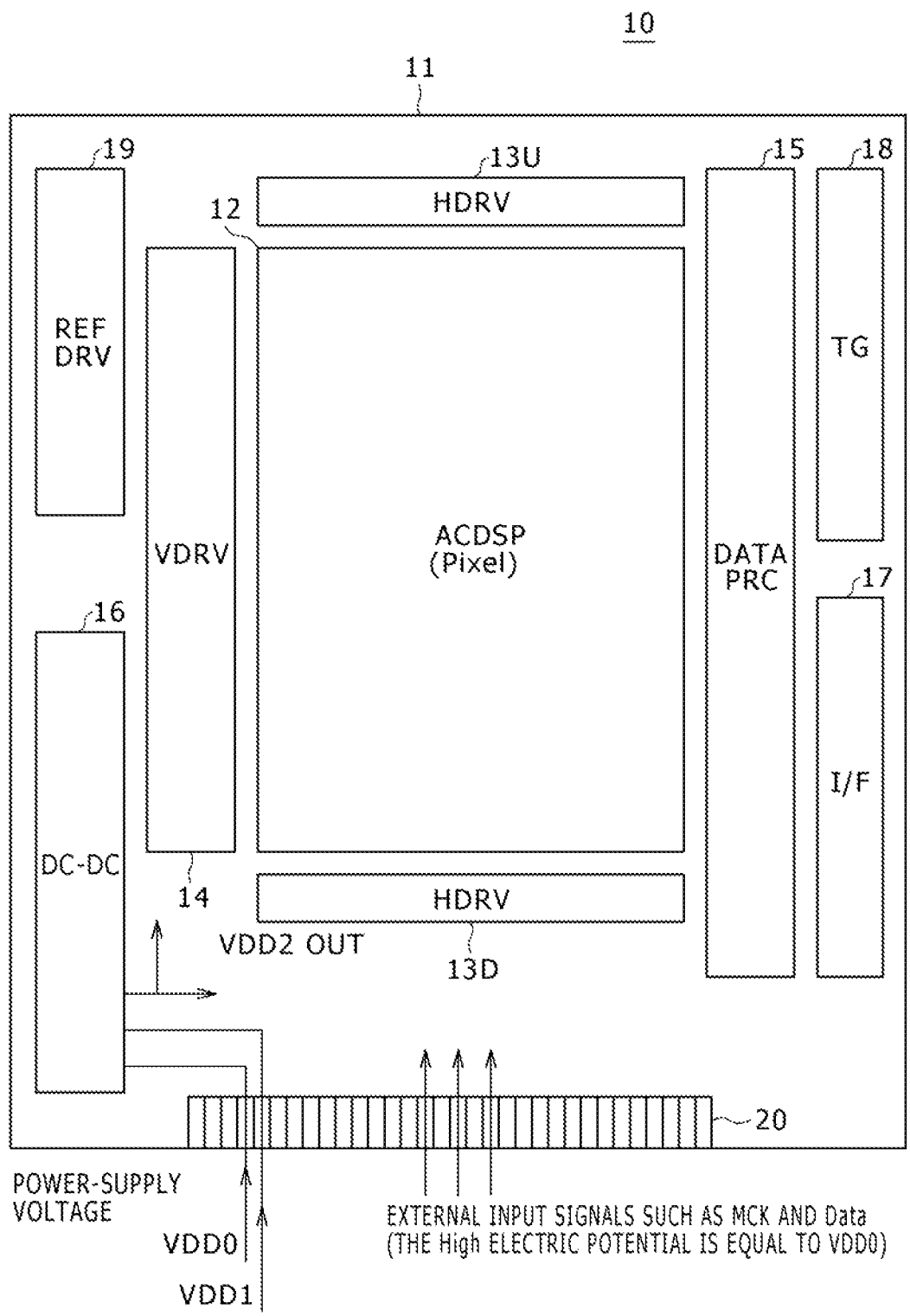
FIG. 3 is a diagram showing the configuration of a layout of a built-in driving-circuit display apparatus according to an embodiment.
Figure 4:
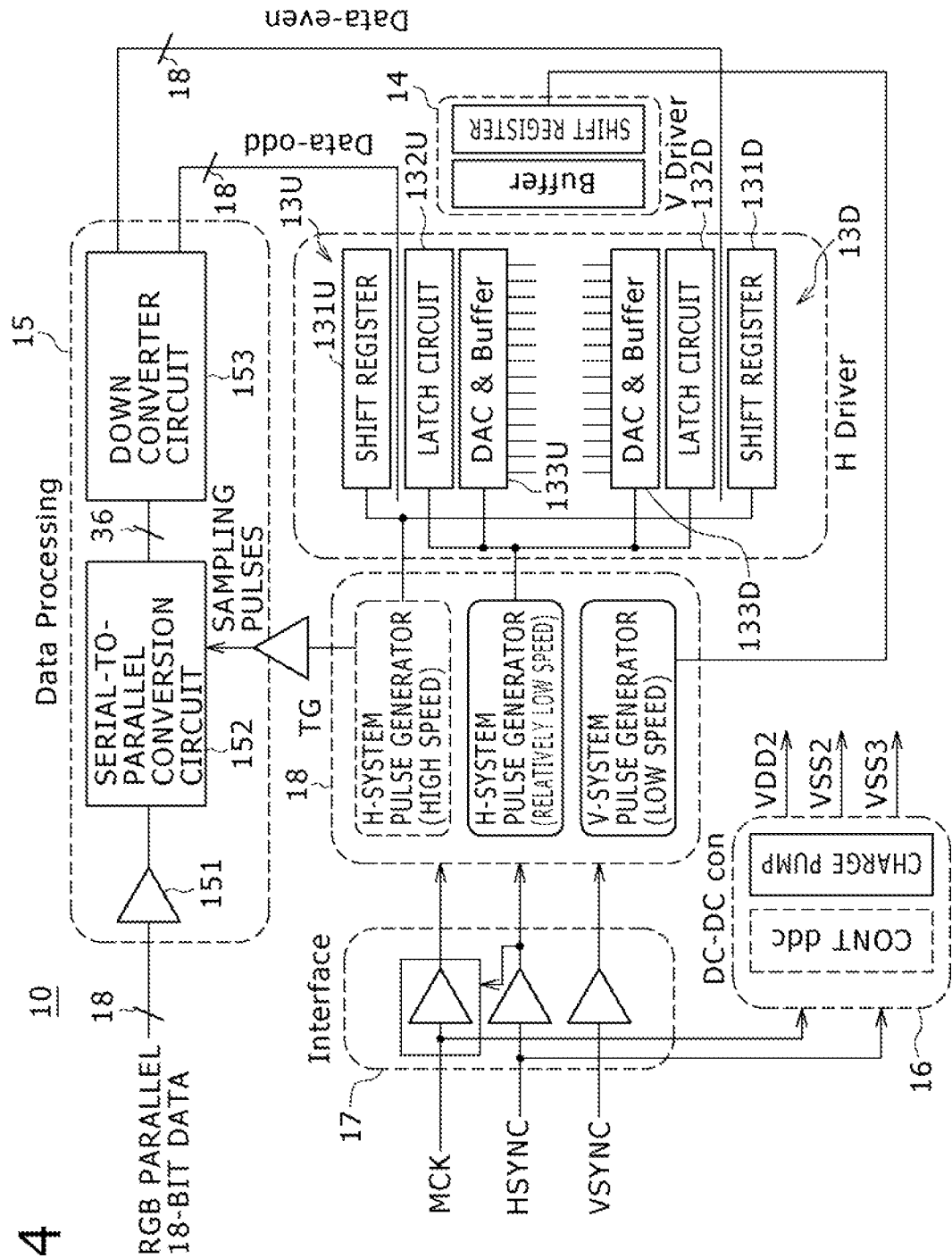
FIG. 4 is a system block diagram showing circuit functions of the built-in driving-circuit display apparatus according to an embodiment.

Each of FIGS. 3 and 4 is a diagram roughly showing a typical configuration of a built-in driving-circuit display apparatus according to an embodiment. To be more specific, FIG. 3 is a diagram showing the configuration of a layout of the built-in driving-circuit display apparatus according to the embodiment whereas FIG. 4 is a system block diagram showing circuit functions of the built-in driving-circuit display apparatus.

As will be described later in detail, the built-in driving-circuit display apparatus according to an embodiment makes use of a contact structure of a semiconductor device according to an embodiment as a contact structure, which allows three or more wiring layers (each referred to as a conductive layer) to be connected to each other with the highest degree of efficiency by making use of a minimum area, in order to reduce the size of a display panel or narrow an area occupied by the peripheral parts.

As an example, the following description explains a case in which the embodiment implements an active-matrix liquid-crystal display apparatus 10 making use of liquid-crystal cells as electro-optical devices which each function as a pixel.

As shown in FIG. 3, the liquid-crystal display apparatus 10 has components integrated on a transparent insulation substrate of the liquid-crystal display apparatus 10. The transparent insulation substrate is typically a glass substrate 11. The components integrated in the liquid-crystal display apparatus 10 include an effective display section (ACDSP) 12, a pair of horizontal driving circuits (each referred to as an H driver or an HDRV) 13U and 13D, a vertical driving circuit (referred to as a V driver or a VDRV) 14, a data processing circuit (DATAPRC) 15, a power-supply circuit (DC-DC) 16, an interface circuit (I/F) 17, a timing generator (TG) 18 and a reference-voltage driving circuit (REFDRV) 19. The effective display section 12 has a plurality of pixels arranged in the form of a matrix as pixels each including a liquid-crystal cell. The horizontal driving circuits 13U and 13D are provided respectively on two sides shown in FIG. 3 as the upper and lower sides of the effective display section 12. The vertical driving circuit 14 is provided on a side shown in FIG. 3 as a side of the effective display section 12. The power-supply circuit 16 is a DC-DC converter. The reference-voltage driving circuit 19 is a circuit for providing a plurality of reference driving voltages to other circuits such as the horizontal driving circuits 13U and 13D.

In addition, an input pad 20 for inputting data or the like is provided on a particular edge of the glass substrate 11. The particular edge of the glass substrate 11 is an edge in close proximity to the lower horizontal driving circuit 13D.

The glass substrate 11 includes a first substrate and a second substrate. On the first substrate, a plurality of pixel circuits each including an active device such as a transistor are arranged in the form of a matrix. The second substrate faces the first substrate, being provided at a location geometrically displayed from the first substrate by a gap with a thickness determined in advance. A liquid crystal is enclosed between the first and second substrates.

A group of circuits created on the glass substrate 11 serving as an insulation substrate is made typically in a low-temperature polysilicon TFT process. That is to say, the liquid-crystal display apparatus 10 includes the horizontal driving circuits 13U and 13D as well as the vertical driving circuit 14 which are created in the surrounding parts (or the peripheral parts) of the effective display section 12. The horizontal driving circuits 13U and 13D as well as the vertical driving circuit 14 forming a driving system are integrated with the effective display section 12 to form a single unit on the effective display section 12 common to the effective display section 12, the horizontal driving circuits 13U and 13D as well as the vertical driving circuit 14 by making use of polysilicon TFTs.

As described above, in the liquid-crystal display apparatus 10 according to an embodiment, the two horizontal driving circuits 13U and 13D are provided respectively on two sides shown in FIG. 3 as the upper and lower sides of the effective display section 12. The horizontal driving circuits 13U and 13D are used for driving signal lines by dividing the signal lines into odd-numbered signal lines and even-numbered signal lines.

In each of the two horizontal driving circuits 13U and 13D, three pieces of digital data are stored in a sampling latch circuit. A digital-to-analog conversion circuit shared by the three pieces of digital data in one horizontal period (H) carries out a conversion process three times in order to convert the three pieces of digital data into three pieces of analog data respectively, and the three pieces of analog data are selected during the horizontal period on a time-division basis and output to a signal line in accordance with the so-called RGB selector method.

In the effective display section 12, a plurality of pixel circuits each including a liquid-crystal cell are arranged in the form of a matrix. Also in the effective display section 12, signal lines driven by the horizontal driving circuits 13U and 13D and vertical scan lines driven by the vertical driving circuit 14 are arranged in the form of a matrix.

Figure 5:
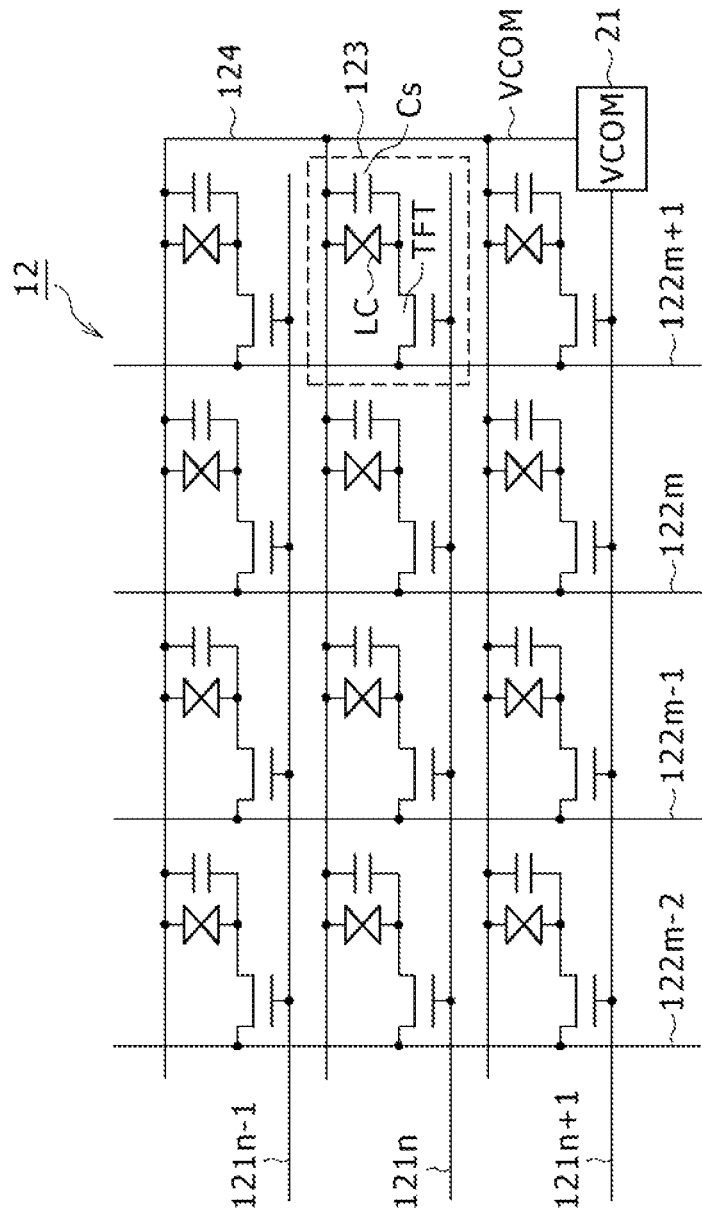
FIG. 5 is a diagram showing a typical concrete configuration of an effective display unit of a liquid-crystal display apparatus.

FIG. 5 is a diagram showing a typical concrete configuration of the effective display section 12. In order to make the diagram simple, the pixel circuits are arranged in the form of a typical matrix consisting of three rows and four columns. The three rows are referred to as the (n−1)th to (n+1)th rows respectively whereas the four columns are referred to as the (m−2)th to (m+1)th columns respectively.

As shown in FIG. 5, the effective display section 12 also includes three vertical scan lines denoted by reference numerals of 121$n$−1, 121$n$ and 121$n$+1 respectively as well as four signal lines denoted by reference numerals of 122$m$−2, 122$m$−1, 122$m$ and 122$m$+1 respectively. The vertical scan lines and the signal lines are arranged in the form of a matrix including an element at each of intersections of the vertical scan lines and the signal lines. At each of the intersections, a unit pixel 123 is provided.

The unit pixel 123 has a configuration including a TFT (Thin Film Transistor) serving as a pixel transistor, an LC (Liquid-crystal Cell) and a storage capacitor Cs. The liquid-crystal cell LC is a capacitor having a capacitance created between a pixel electrode connected to the thin film transistor TFT and an opposite electrode facing the pixel electrode. In the following description, the pixel electrode and the opposite electrode are also referred to as a particular electrode and another electrode respectively.

The gate electrode of the thin film transistor TFT is connected to one of the vertical scan lines 121$n$−1, 121$n$ and 121$n$+1. On the other hand, the source electrode of the thin film transistor TFT is connected to one of the signal lines 122$m$−2, 122$m$−1, 122$m$ and 122$m$+1.

The pixel electrode of the liquid-crystal cell LC is connected to the drain electrode of the thin film transistor TFT. On the other hand, the opposite electrode of the liquid-crystal cell LC is connected to a common line 124. The storage capacitor CS is connected between the drain electrode of the thin film transistor TFT and the common line 124.

The common line 124 receives an AC voltage determined in advance from a VCOM circuit 21 as a common voltage Vcom. The VCOM circuit 21 is integrated with the driving circuits or the like typically on the glass substrate 11.

One end of each of the vertical scan lines 121$n$−1, 121$n$ and 121$n$+1 in the effective display section 12 is connected to the output end of a corresponding row of the vertical driving circuit 14 shown in FIG. 3. The corresponding row is a row corresponding to the vertical scan line.

The configuration of the vertical driving circuit 14 typically includes a shift register for sequentially generating vertical select pulses synchronously with vertical clock pulses VCK shown in none of the figures. The vertical select pulses are asserted on the vertical scan lines 121$n$−1, 121$n$ and 121$n$+1 in order to carry out a vertical scan operation.

In addition, one end of each of odd-numbered lines among the signal lines, 122$m$−1, and 122$m$+1 in the effective display section 12 is connected to the output end of a corresponding column of the upper horizontal driving circuit 13U shown in FIG. 3. The corresponding column is a column corresponding to the signal line. On the other hand, the other end of each of even-numbered lines among the signal lines 122$m$−2, 122$m$−1, 122$m$ and 122$m$+1 in the effective display section 12 is connected to the output end of a corresponding column of the lower horizontal driving circuit 13D shown in FIG. 3. The corresponding column is a column corresponding to the signal line.

In each of the two horizontal driving circuits 13U and 13D, three pieces of digital data are stored in a sampling latch circuit. The three pieces of digital data are R data, B data and G data. A digital-to-analog conversion circuit shared by the three pieces of digital data in one horizontal period (H) carries out a conversion process three times in order to convert the three pieces of digital data into three pieces of analog data respectively and the three pieces of analog data are selected during the horizontal period on a time-division basis and output to a corresponding signal line.

The upper horizontal driving circuit 13U employs an upper shift-register group 13U, a sampling latch circuit group, an upper line-sequential conversion latch circuit group 132U and a digital/analog conversion (DAC) circuit group 133u. The upper shift-register group 13U is a register group for sequentially outputting shift pulses (or sampling pulses) from transfer stages synchronously with horizontal clock pulses HCK shown in none of the figures. The sampling latch circuit group is a circuit group for sequentially sampling digital image data and latching the sampled digital image data with timings determined by the sampling pulses generated by the upper shift-register group 13U. The upper line-sequential conversion latch circuit group 132U is a circuit group for putting the digital image data latched in the sampling latch circuit group into a line sequential order. The upper digital/analog conversion circuit group 133U is a circuit group for converting the digital image data put into a line sequential order by the upper line-sequential conversion latch circuit group 132U into an analog image signal.

By the same token, the lower horizontal driving circuit 13D employs a lower shift-register group 13D, a sampling latch circuit group, a lower line-sequential conversion latch circuit group 132D and a digital/analog conversion (DAC) circuit group 133d. The lower shift-register group 13D is a register group for sequentially outputting shift pulses (or sampling pulses) from transfer stages synchronously with horizontal clock pulses HCK shown in none of the figures. The sampling latch circuit group is a circuit group for sequentially sampling digital image data and latching the sampled digital image data with timings determined by the sampling pulses generated by the lower shift-register group 13D. The lower line-sequential conversion latch circuit group 132D is a circuit group for putting the digital image data latched in the sampling latch circuit group into a line sequential order. The lower digital/analog conversion circuit group 133D is a circuit group for converting the digital image data put into a line sequential order by the lower line-sequential conversion latch circuit group 132D into an analog image signal.

It is to be noted that, normally, at the output stage of each of the digital/analog conversion circuit groups 133U and 133D, a buffer such as a CMOS inverter is provided.

The data processing circuit 15 employs a level shifter 151, a serial/parallel conversion circuit 152 and a down converter 153. The level shifter 151 is a component for shifting up the level of R, G, B parallel digital data supplied by an external source from the range 0 to 3 V (or 2.9 V) to 6 V. The serial/parallel conversion circuit 152 is a component for converting the R, G, B digital data completing the level shifting process in the level shifter 151 from serial data into parallel data in order to adjust the phase of the data and lower the frequency of the data. The down converter 153 is a component for shifting down the parallel data supplied by the serial/parallel conversion circuit 152 from 6 V to the range 0 to 3 V (or 2.9 V) and for outputting odd data to the upper horizontal driving circuit 13U and even data to the lower horizontal driving circuit 13D.

The power-supply circuit 16 including a DC-DC converter receives a liquid-crystal voltage VDD1 of typically 2.9 V from an external source. The power-supply circuit 16 boosts the liquid-crystal voltage VDD1 to a panel internal voltage VDD2 of typically 5.8 V of a 6V system, which is two times 2.9 V, and supplies the panel internal voltage VDD2 to circuits employed in the liquid-crystal panel. The power-supply circuit 16 boosts the liquid-crystal voltage VDD1 to the panel internal voltage VDD2 synchronously with a master clock signal MCK and/or a horizontal synchronization signal Hsync, which are generated by the interface circuit 17. As an alternative, the power-supply circuit 16 boosts the liquid-crystal voltage VDD1 to the panel internal voltage VDD2 on the basis of a corrected clock signal and the horizontal synchronization signal Hsync. The corrected clock signal is a result of a correction process carried out by a system determined in advance to correct a clock signal generated by an embedded oscillation circuit at a low frequency or a low speed. The clock signal generated by the embedded oscillation circuit needs to be corrected because the oscillation frequency of the embedded oscillation circuit varies.

In addition, the power-supply circuit 16 also generates a negative panel internal voltage VSS2 of typically −1.9 V and a negative panel internal voltage VSS3 of typically −3.8 V, supplying these voltages to predetermined circuits in the liquid-crystal panel.

The interface circuit 17 is a component for shifting the levels of the master clock signal MCK, the horizontal synchronization signal Hsync and a vertical synchronization signal Vsync, which are supplied by external sources, to a panel internal logic level such as a VDD2 level and for supplying the master clock signal MCK, the horizontal synchronization signal Hsync and the vertical synchronization signal Vsync, which are each obtained as a result of the level-shifting process, to the timing generator 18. The interface circuit 17 also supplies the horizontal synchronization signal Hsync obtained as a result of the level-shifting process to the power-supply circuit 16.

In the case of a configuration in which the power-supply circuit 16 boosts the liquid-crystal voltage VDD1 on the basis of a corrected clock signal obtained as a result of correcting a clock signal, which is generated by an embedded oscillation circuit, without making use of the master clock signal MCK, it is possible to configure the interface circuit 17 to supply no master clock signal MCK to the power-supply circuit 16. As an alternative, it is possible sustain the line for supplying the master clock signal MCK from the interface circuit 17 to the power-supply circuit 16 as it is but set the power-supply circuit 16 not to use the master clock signal MCK in an operation to boost the liquid-crystal voltage VDD1.

The timing generator 18 is a component for generating a horizontal start pulse HST, horizontal clock pulses HCK (HCKX), a vertical start pulse VST and vertical clock pulses VCK (VCKX) synchronously with the master clock signal MCK, the horizontal synchronization signal Hsync and the vertical synchronization signal Vsync, which are received from the interface circuit 17. The timing generator 18 supplies the horizontal start pulse HST and the horizontal clock pulses HCK (HCKX) to the horizontal driving circuits 13U and 13D to be used as clock signals for the horizontal driving circuits 13U and 13D. On the other hand, the timing generator 18 supplies the vertical start pulse VST and the vertical clock pulses VCK (VCKX) to the vertical driving circuit 14 to be used as clock signals for the vertical driving circuit 14.

The above description has explained the configuration and function of every component created on the liquid-crystal panel of the liquid-crystal display apparatus according to the embodiment.

Next, the following description explains a contact structure allowing the size of the display panel according to the embodiment to be reduced or the area occupied by the peripheral parts of the panel to be narrowed. That is to say, the following description explains a contact structure of a semiconductor device according to the embodiment as a contact structure allowing three or more wiring layers (each referred to as a conductive layer) to be connected to each other with the highest degree of efficiency by making use of a minimum area.

The contact structure of a semiconductor device according to an embodiment can be applied to the effective display section 12 and peripheral circuits of the effective display section 12. The peripheral circuits of the effective display section 12 include the horizontal driving circuits 13U and 13D, the vertical driving circuit 14, the data processing circuit 15 (or the DATAPRC 15), the power-supply circuit 16 (or the DC-DC circuit 16), the interface circuit 17 (or the IF 17), the timing generator 18 (or the TG 18) and the reference-voltage driving circuit 19 (or the REFDRV 19).

Each of FIGS. 6A and 6B is a diagram showing the basic configuration of a contact structure according to the embodiment. To be more specific, FIG. 6A is a diagram showing a cross section of the contact structure whereas FIG. 6B is a diagram showing a top view of the contact structure.

In the case of a typical semiconductor device shown in FIG. 6, in a contact area ARCNT201 indicated by a dashed-line circle in FIG. 6A, the contact structure according to the embodiment is adopted.

In a typical semiconductor device 200 according to an embodiment, n (where notation n denotes a positive integer at least equal to three) conductive layers are basically created as stacked layers on a substrate 201 and connected to each other through a contact pattern.

In the case of the typical semiconductor device 200 shown in FIG. 6, n=3. The three conductive layers created as stacked layers on the substrate 201 are conductive layers 202, 203 and 204 which are connected to each other through a contact pattern. It is to be noted that a first interlayer insulation film 206 is created selectively on the substrate 201 and between the conductive layers 202 and 203. In addition, a second interlayer insulation film 207 is created selectively on the first interlayer insulation film 206 and the conductive layer 203.

A main contact area in which a contact pattern CPTN is created includes (n−1) connection areas for connecting (n−1) conductive layers respectively to the nth conductive layer.

To put it concretely, in the case of the typical semiconductor device 200 shown in FIG. 6A, n=3 and, thus, a main contact area MCNT201 in which a contact pattern CPTN is created includes 2 (=n−1=3−1) connection areas 211 and 212 for connecting the 2 (=n−=3−1) conductive layers 202 and 203 respectively to the conductive layer 204.

In addition, every two adjacent conductive layers of the (n−1) conductive layers, which are included in the n conductive layers but exclude the outermost conductive layer serving as the nth conductive layer of the n conductive layers, conceptually form a conductive-layer pair consisting of these two adjacent conductive layers which are referred to respectively as the pair first and second conductive layers of the conductive-layer pair. Every pair second conductive layer provided at a location geometrically displayed away from a pair first conductive layer pertaining to the same conductive-layer pair as the pair second conductive layer in the stacking direction of a lamination process to pile up the (n−1) conductive layers on the substrate 201 is created so that the end part of the pair second conductive layer faces a portion of the edge of the contact pattern. The stacking direction of a lamination process to pile up the (n−1) conductive layers on the substrate 201 is a direction perpendicular to the main surface of the substrate 201.

To put it concretely, in the case of the typical semiconductor device 200 shown in FIG. 6A, n=3 and, thus, the 2 (=n−1=3−1) conductive layers are the conductive layers 202 and 203. The conductive layer 203 is provided at a location geometrically displayed away from the conductive layer 202 serving as the pair first conductive layer in the stacking direction of a lamination process to pile up the conductive layers 202 and 203 on the substrate 201, that is, in the direction perpendicular to the main surface of the substrate 201, to serve as the pair second conductive layer. The conductive layer 203 is created so that the end part 203T of the pair first conductive layer 203 faces a portion of the edge of the contact pattern (or a contact hole) CPTN. That is to say, the conductive layer 203 is created so that the conductive layer 203 has an area that exists not beyond the portion of the edge of the contact pattern CPTN. FIG. 6A shows a configuration in which the conductive layer 203 occupies a portion in the contact area ARCNT 201 or a configuration in which the conductive layer 203 does not occupy the portion of the edge of the contact pattern CPTN.

The (n−1) conductive layers are electrically connected to each other by the nth conductive layer. The nth conductive layer is created so that the nth conductive layer fills up the contact hole serving as the contact pattern CPTN.

To put it concretely, in the case of the typical semiconductor device 200 shown in FIG. 6A, the conductive layers 202 and 203 are electrically connected to each other by the conductive layer 204 which fills up the contact hole serving as the contact pattern CPTN.

This contact structure is further explained concretely as follows.

Figure 7A:
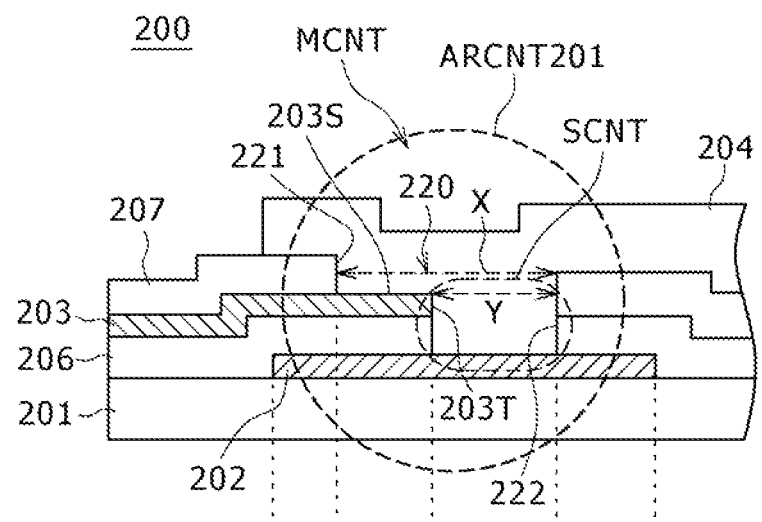
FIG. 7A is a diagram showing a cross section of the contact structure.
Figure 7B:
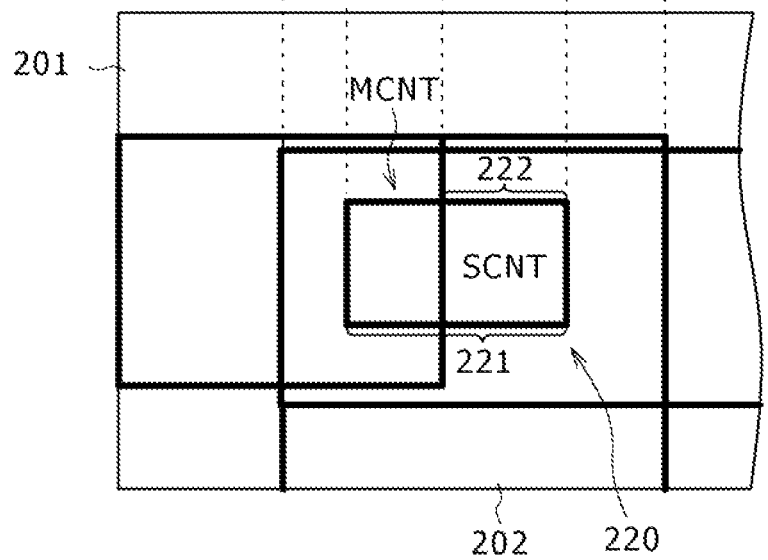
FIG. 7B is a diagram showing a top view of the contact structure.

Each of FIGS. 7A and 7B is an enlarged diagram showing the contact area adopting the contact structure shown in FIG. 6 as a contact structure according to an embodiment.

In the semiconductor device 200 according to an embodiment, a contact hole is created in the main contact area MCNT 201 to serve as a contact pattern. Any two adjacent individual conductive layers included in the (n−1) conductive layers, which exclude the outermost conductive layer serving as the nth conductive layer, conceptually form a conductive-layer pair. In any conductive-layer pair, a conductive layer provided at a location geometrically displaced in a direction opposite to the stacking direction of a lamination process to pile up the conductive layers on the substrate 201 is referred to as a pair first conductive layer of the conductive-layer pair whereas a conductive layer provided at a location geometrically displaced in the stacking direction of the lamination process is referred to as a pair second conductive layer of the conductive-layer pair. The main contact area MCNT in which the contact hole is created as described above includes (n−2) sub-contact areas SCNT each used for connecting the pair first conductive layer to the pair second conductive layer pertaining to the same conductive-layer pair as the pair first conductive layer through a second contact hole to be described later. On the other hand, the (n−1) connection areas mentioned above are used for the connecting (n−1) respective conductive layers to the nth conductive layer.

In the case of the typical semiconductor device 200 shown in FIG. 7, the two conductive layers stacked consecutively to conceptually form a conductive-layer pair are the conductive layers 202 and 203, which exclude the conductive layer 204. The conductive layer 202 provided at a location geometrically displaced in a direction opposite to the stacking direction of a lamination process to pile up the conductive layers on the substrate 201 serves as the pair first conductive layer of a conductive-layer pair. On the other hand, the conductive layer 203 provided at a location geometrically displaced in the stacking direction of the lamination process to pile up the conductive layers on the substrate 201 serves as the pair second conductive layer of the same conductive-layer pair. The main contact area MCNT in which the contact hole 220 is created as described above includes 1 (=n−2=3−2) sub-contact area SCNT for connecting the conductive layer 202 to the conductive layer 203 through a second contact hole to be described below. On the other hand, the connection areas 211 and 212 are used for connecting the 2 (=n−1=3−1) conductive layers 202 and 203 respectively to the conductive layer 204 as described above.

The contact hole 220 includes a first contact hole 221 created in the aforementioned contact area ARCNT 201 of the main contact area MCNT 201 as a contact hole having a diameter stretched over an exposed area of each of the (n−1) conductive layers, which are included in the n conductive layers but exclude the outermost conductive layer serving as the nth conductive layer of the n conductive layers. The contact hole also includes the (n−2) aforementioned second contact holes 222 each created in a particular one of the sub-contact areas SCNT 201 of the main contact area MCNT 201 as a contact hole connected to the first contact hole 221 and extended to the surface of the pair first conductive layer of the conductive-layer pair associated with the particular sub-contact area SCNT 201.

In the case of the typical semiconductor device 200 shown in FIG. 7, the contact hole 220 includes a first contact hole 221 created in the contact area ARCNT 201 as a contact hole having a diameter X stretched over an exposed area of each of the two conductive layers 202 and 203, which are included in the three conductive layers 202 to 204 but exclude the outermost conductive layer serving as the last conductive layer 204 of the three conductive layers 202 to 204. The contact hole also includes 1 (=n−2=3−2) second contact hole 222 created in the sub-contact area SCNT 201 as a contact hole connected to the first contact hole 221 and extended to the surface of the conductive layer 202 serving as the pair first conductive layer of the conductive-layer pair associated with the sub-contact area SCNT 201. The diameter Y of the second contact hole 222 is smaller than the diameter X of the first contact hole 221, that is, X>Y.

In each specific one of the sub-contact areas SCNT, the pair second conductive layer connected in the specific sub-contact area is created so that the upper surface of the pair second conductive layer faces the first contact hole whereas the end part of the pair second conductive layer faces the second contact hole created in the specific sub-contact area.

In the case of the typical semiconductor device 200 shown in FIG. 7, in the sub-contact area SCNT, the conductive layer 203 serving as the pair second conductive layer of the conductive-layer pair is created so that the upper surface 203S of the conductive layer 203 faces the first contact hole 221 whereas the end part 203T of the conductive layer 203 faces the second contact hole 222 created in the sub-contact area SCNT.

The outermost conductive layer serving as the nth conductive layer of the n conductive layers is created, starting from the pair first conductive layers each located inside one of the second contact holes each created in one of the sub-contact areas and ending at the outermost surface of the semiconductor device, and is connected to the end parts of the pair second conductive layers as well as the upper surfaces of the pair second conductive layers in the first contact hole.

In the case of the typical semiconductor device 200 shown in FIG. 7, the outermost conductive layer serving as the last conductive layer 204 of the three conductive layers is created, starting from the conductive layer 202 placed inside the second contact hole 222 to serve as the pair first conductive layer and ending at the outermost surface of the semiconductor device, and is connected to the end part 203T of the conductive layer 203 serving as the pair second conductive layer as well as the upper surface 203S of the conductive layer 203 in the first contact hole 221.

As described above, an interlayer insulation film is created between any two adjacent conductive layers to be connected to each other. In this case, it is desirable to adjust the thickness of each interlayer insulation film to such a value that the outermost conductive layer is not broken at a step. In particular, it is desirable to create each interlayer insulation film with a thickness smaller than the thickness of the outermost conductive layer serving as the nth conductive layer (the thickness of the outermost conductive layer>the thickness of each interlayer insulation film).

In the case of the typical semiconductor device 200 shown in each of FIGS. 6 and 7, the thickness of the second interlayer insulation film 207 is made smaller than the thickness of the conductive layer 204 serving as the third conductive layer.

Figure 1:
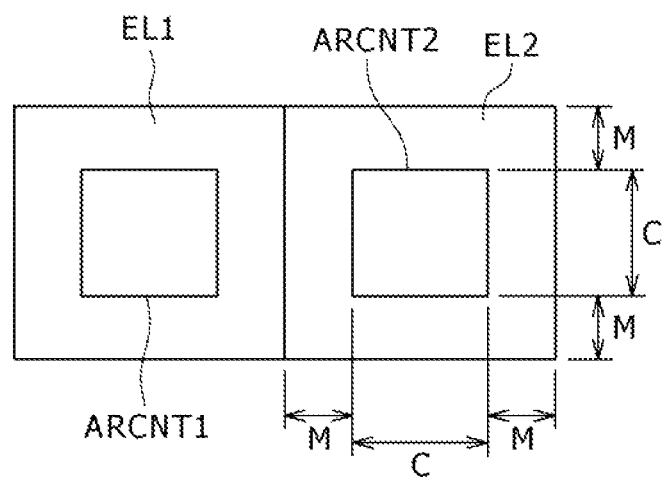
FIG. 1 is a diagram showing a top view of a typical contact creation area in which contact portions are created by adoption of an ordinary method.
Figure 8:
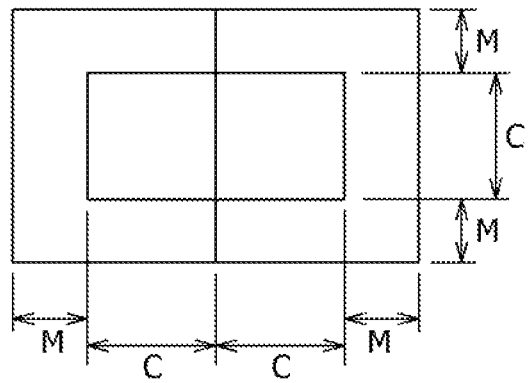
FIG. 8 is a diagram showing a top view of a basic example of a contact creation area according to an embodiment.

FIG. 8 is a diagram showing a top view of a basic example of a contact creation area according to an embodiment. Much like the contact creation areas shown in FIGS. 1 and 2, notation C shown in FIG. 8 denotes the size of a minimum contact hole whereas notation M denotes a necessary margin set by considering an alignment shift between layers.

In this embodiment, the contact creation area is desired to have a size of (C+2×M)×(2×C+2×M). Thus, in accordance with the embodiment, an area having a size of (C+2×M)×(2×M) can be eliminated from the contact creation area shown in FIG. 1, making miniaturization possible. The size of (C+2×M)×(2×M) is a difference in size between the contact creation areas shown in FIG. 1.

Figure 2:
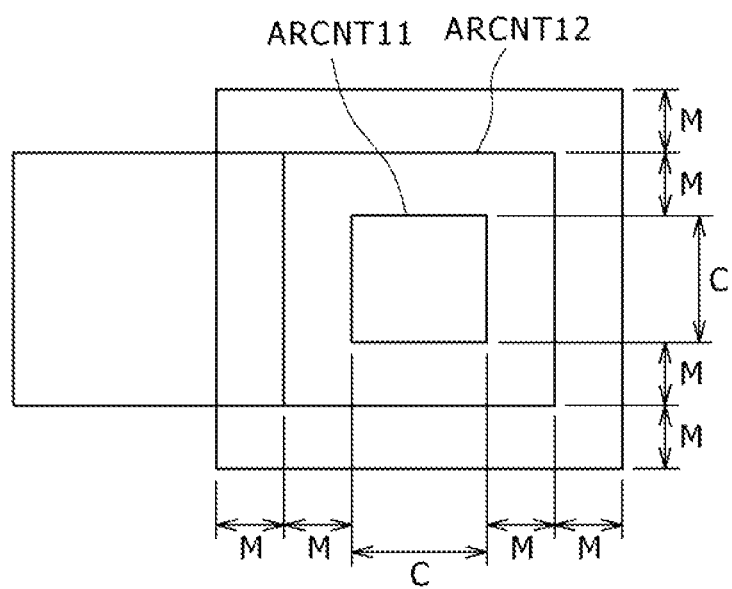
FIG. 2 is a diagram showing a top view of a typical contact creation area for connecting a scan line and a signal line to pixel electrodes by adoption of a fabrication method.

In addition, an area having a size of $(-C^2+2\times C\times M+12\times M^2)$ can be eliminated from the contact creation area shown in FIG. 2.

Inspection of the specifications of a gh line exposure apparatus used in production of liquid-crystal display apparatus, the contact creation area according to an embodiment normally has an effect of an area reduction of 33%. In the case of the gh line exposure apparatus, the minimum line width C is 3 μm whereas the alignment margin M is 1.5 μm.

Figure 9:
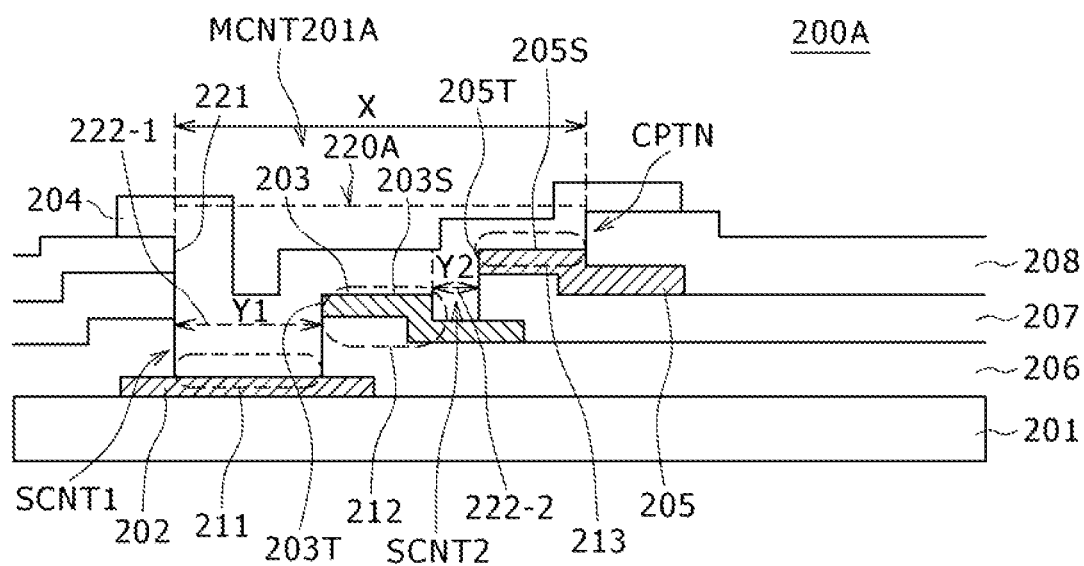
FIG. 9 is a diagram showing another typical configuration of the contact structure according to an embodiment.

FIG. 9 is a diagram showing another typical configuration of the contact structure according to an embodiment.

In the case of the typical semiconductor device 200 shown in each of FIGS. 6 and 7, n is set at 3. That is to say, the contact structure is used for connecting three conductive layers to each other. In the case of the semiconductor device 200A shown in FIG. 9, on the other hand, n is set at 4. That is to say, the typical contact structure is used for connecting four conductive layers to each other.

It is to be noted that, in order to make the explanation simple, configuration components included in the typical contact structure shown in FIG. 9 as components identical with their respective counterparts included in the typical semiconductor device 200 shown in each of FIGS. 6 and 7 are denoted by the same reference notations as the counterparts.

In the typical semiconductor device 200A shown in FIG. 9, n is set at 4. That is to say, four conductive layers 202, 203, 205 and 204 are created on the substrate 201. The four conductive layers 202, 203, 205 and 204 are connected to each other through a contact pattern. It is to be noted that a first interlayer insulation film 206 is created selectively on the substrate 201 and between the conductive layers 202 and 203 whereas a second interlayer insulation film 207 is created selectively on the first interlayer insulation film 206 and between the conductive layers 203 and 205. In addition, an interlayer insulation film 209 is created selectively on the second interlayer insulation film 207 and the conductive layer 205.

In the typical semiconductor device 200A shown in FIG. 9, n=4 and, thus, a main contact area MCNT in which a contact pattern CPTN is created includes 3 (=n−1=4−1) connection areas 211, 212 and 213 for connecting the 3 (=n−1=4−1) conductive layers 202, 203 and 205 which exclude the outermost conductive layer 204.

In addition, in the case of the typical semiconductor device 200A shown in FIG. 9, n=4 and, thus, the 3 (=n−1=4−1) conductive layers are the conductive layers 202, 203 and 205. The conductive layer 203 is provided at a location geometrically displayed away from the conductive layer 202 pertaining to the same conductive-layer pair as the conductive layer 203 in the stacking direction of a lamination process to pile up the conductive layers 202, 203 and 205 on the substrate 201, that is, in the direction perpendicular to the main surface of the substrate 201. The conductive layer 203 is created so that the end part 203T of the pair second conductive layer 203 faces a portion of the edge of the contact pattern (or a contact hole) CPTN. That is to say, the conductive layer 203 is created so that the conductive layer 203 has an area that exists not beyond the portion of the edge of the contact pattern CPTN. FIG. 9 shows a configuration in which the conductive layer 203 occupies a portion in the contact area MCNT 201A or a configuration in which the conductive layer 203 does not occupy the portion of the edge of the contact pattern CPTN.

By the same token, the conductive layer 205 is provided at a location geometrically displayed away from the conductive layer 203 pertaining to the same conductive-layer pair as the conductive layer 205 in the stacking direction of a lamination process to pile up the conductive layers 202, 203 and 205 on the substrate 201. The conductive layer 205 is created so that the end part 205T of the pair second conductive layer 205 faces a portion of the edge of the contact pattern (or a contact hole) CPTN. That is to say, the conductive layer 205 is created so that the conductive layer 205 has an area that exists not beyond the portion of the edge of the contact pattern CPTN. FIG. 9 shows a configuration in which the conductive layer 206 occupies a portion in the contact area MCNT 201A or a configuration in which the conductive layer 205 does not occupy the portion of the edge of the contact pattern CPTN.

In the case of the typical semiconductor device 200A shown in FIG. 9, the conductive layers 202, 203 and 205 are electrically connected to each other by the conductive layer 204 filling up the contact hole serving as the contact pattern CPTN.

This contact structure is further explained concretely as follows.

In the case of the typical semiconductor device 200A shown in FIG. 9, the conductive layers 202 and 203, which exclude the conductive layer 204, are stacked consecutively to conceptually form a first conductive-layer pair. By the same token, the conductive layers 203 and 205, which also exclude the conductive layer 204, are stacked consecutively to conceptually form a second conductive-layer pair. The conductive layer 202 provided at a location geometrically displaced in a direction opposite to the stacking direction of a lamination process to pile up the conductive layers on the substrate 201 serves as the pair first conductive layer of a first conductive-layer pair. On the other hand, the conductive layer 203 provided at a location geometrically displaced in the stacking direction of the lamination process serves as the pair second conductive layer of the first conductive-layer pair. The main contact area MCNT 201A in which a contact hole 220A is created as described above includes 2 (n−2) sub-contact areas SCNT1 and SCNT2. The sub-contact area SCNT1 is used for connecting the conductive layer 202 to the conductive layer 203.

By the same token, the conductive layer 203 provided at a location geometrically displaced in a direction opposite to the stacking direction of the lamination process serves as the pair first conductive layer of the second conductive-layer pair. On the other hand, the conductive layer 205 provided at a location geometrically displaced in the stacking direction of the lamination process serves as the pair second conductive layer of the second conductive-layer pair. The sub-contact area SCNT2 is used for connecting the conductive layer 203 to the conductive layer 205.

The sub-contact areas SCNT1 and SCNT2 are created concurrently, being shifted away from each other over the main contact area MCNT in a direction different from the stacking direction of the lamination process to pile up the conductive layers on the substrate 201.

In the case of the typical semiconductor device 200A shown in FIG. 9, the contact hole 220A includes a first contact hole 221 having a diameter X stretched over an exposed area of each of the three conductive layers 202, 203 and 205 of the four conductive layers 202 to 205 excluding the outermost conductive layer serving as the last conductive layer 204 of the four conductive layers. The contact hole also includes 2 (=n−2=4−2) second contact holes 222-1 and 222-2 created in the sub-contact areas SCNT1 and SCNT2 respectively. The second contact hole 222-1 is connected to the first contact hole 221 and extended to the surface of the conductive layer 202 serving as the pair first conductive layer pertaining to the first conductive-layer pair. The diameter Y1 of the second contact hole 222-1 is smaller than the diameter X of the first contact hole 221A, that is, X>Y1. By the same token, the second contact hole 222-2 is connected to the first contact hole 221 and extended to the surface of the conductive layer 203 serving as the pair first conductive layer pertaining to the second conductive-layer pair. The diameter Y2 of the second contact hole 222-2 is smaller than the diameter X of the first contact hole 221 that is, X>Y2.

In the case of the typical semiconductor device 200A shown in FIG. 9, in the sub-contact area SCNT1, the conductive layer 203 serving as the pair second conductive layer of the first conductive-layer pair is created so that the upper surface 203S of the conductive layer 203 faces the first contact hole 221 whereas the end part 203T of the conductive layer 203 faces the second contact hole 222-1. By the same token, in the sub-contact area SCNT2, the conductive layer 205 serving as the pair second conductive layer of the second conductive-layer pair is created so that the upper surface 205S of the conductive layer 205 faces the first contact hole 221 whereas the end part 205T of the conductive layer 205 faces the second contact hole 222-2.

In the case of the typical semiconductor device 200A shown in FIG. 9, the outermost conductive layer serving as the last conductive layer 204 of the four conductive layers 201 to 205 is created, starting from the conductive layer 202 placed inside the second contact hole 222-1 to serve as the pair first conductive layer in the first conductive-layer pair and ending at the outermost surface of the semiconductor device, and is connected to the end part 203T of the conductive layer 203 serving as the pair second conductive layer pertaining to the first conductive-layer pair as well as the upper surface 203S of the conductive layer 203 in the first contact hole 221.

By the same token, the outermost conductive layer serving as the last conductive layer 204 of the four conductive layers is also created, starting from the conductive layer 203 placed inside the second contact hole 222-2 to serve as the pair first conductive layer in the second conductive-layer pair and ending at the outermost surface of the semiconductor device, and is connected to the end part 205T of the conductive layer 205 serving as the pair second conductive layer pertaining to the second conductive-layer pair as well as the upper surface 205S of the conductive layer 205 in the first contact hole 221.

Figure 10A:
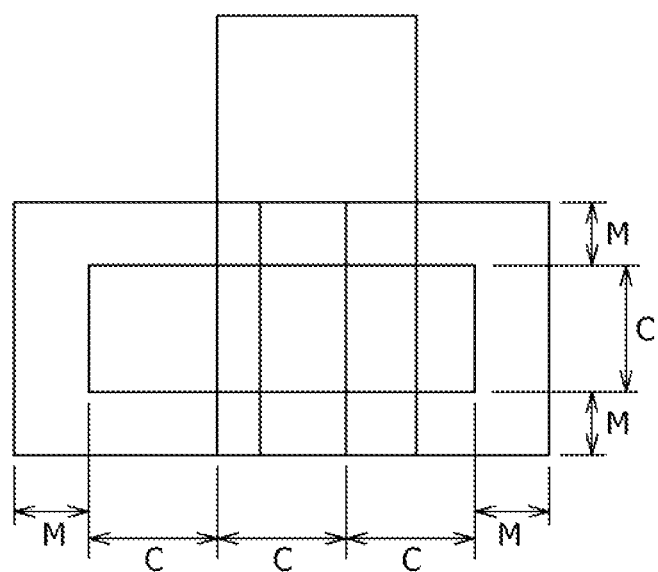
FIG. 10 is a diagram showing a top view of a basic example of a contact creation area of the contact structure shown in FIG. 9.
Figure 10B:
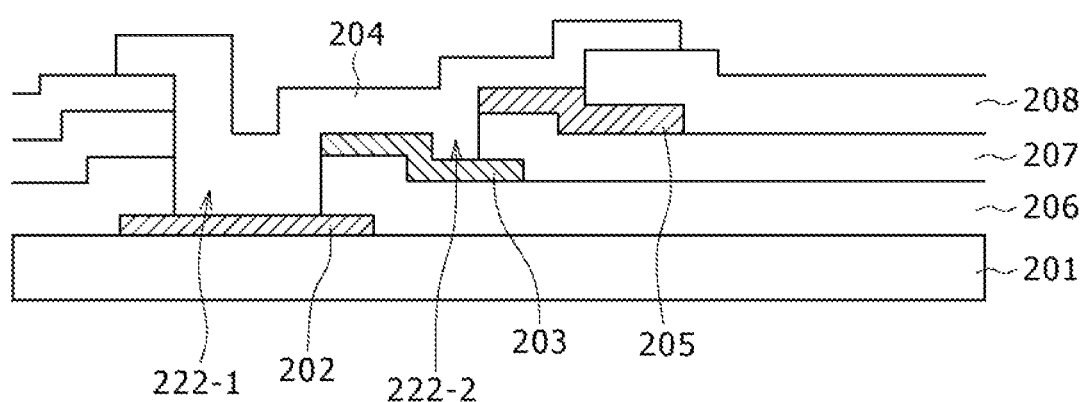

FIG. 10 is a diagram showing a top view of a basic example of the contact creation area shown in FIG. 9. Much like the contact creation areas shown in FIGS. 1, 2 and 8, notation C shown in FIG. 10 denotes the size of a minimum contact hole whereas notation M denotes a necessary margin set by considering an alignment shift between layers.

As described earlier, the typical contact creation area shown in FIG. 10 is an area of contact between four conductive layers. The size of a contact area not adopting the contact structure according to the embodiment is $((C+2M)^2) \times 3$ whereas the size of the contact area according to this embodiment is $(C+2\times M)\times(3\times C+2\times M)$. Thus, the size of the contact area according to this embodiment is smaller than the size of a contact area not adopting the contact structure according to the embodiment by a difference of $(C+2\times M)\times 2\times M\times 2$.

Each of the conductive layers 202 to 205 described above is typically created as a wiring layer. Examples of the wiring layer are electrodes of a transistor such as a TFT. To put it more concretely, the conductive layers 202 to 206 are typically the gate, drain and source electrodes of a transistor.

Figure 11A:
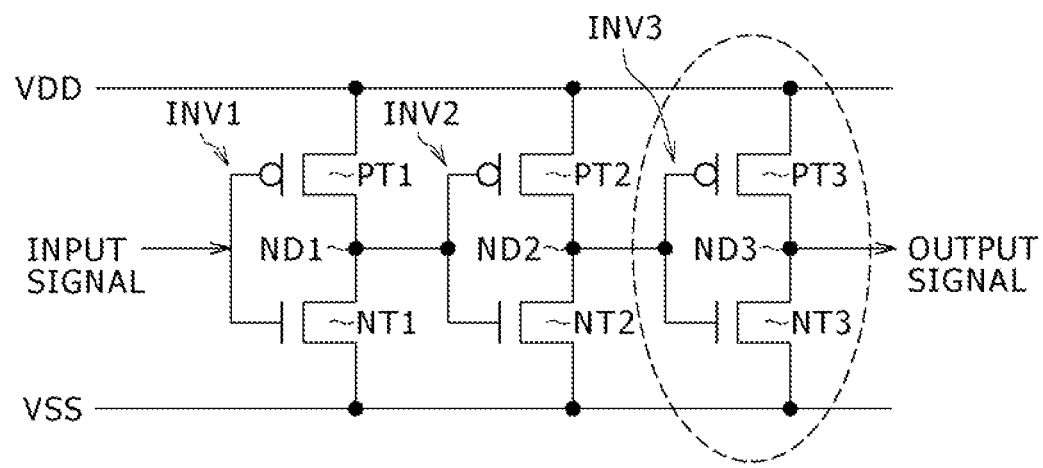
FIG. 11A is a diagram showing an equivalent circuit of a buffer circuit provided typically at the output stage of a horizontal driving circuit as a circuit to which the contact structure according to an embodiment can be applied.
Figure 11B:
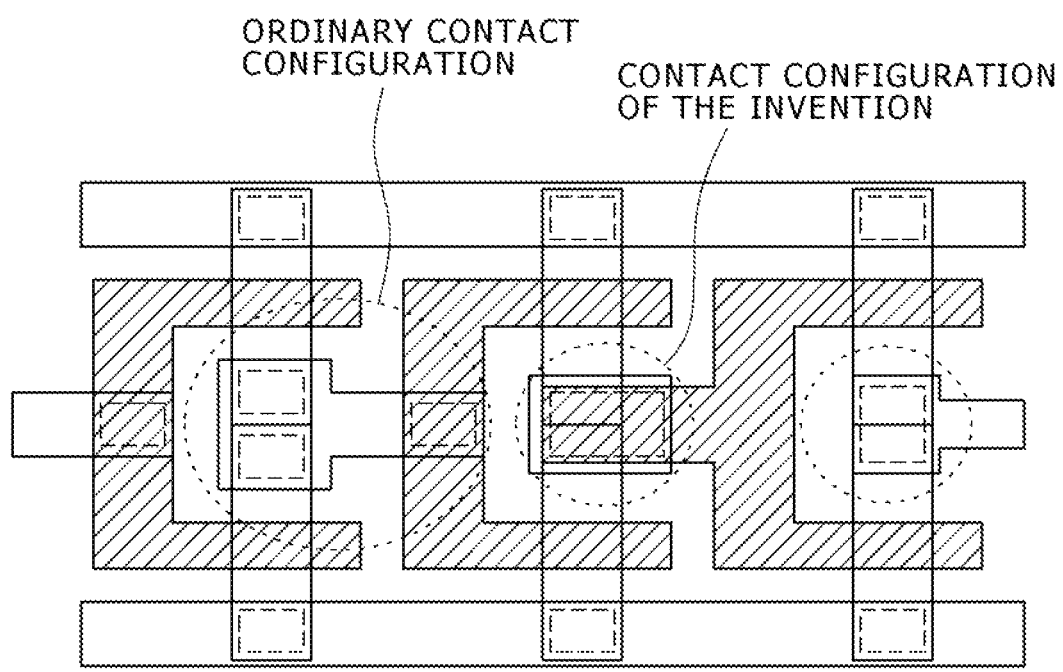
FIG. 11B is a diagram showing typical connection patterns of the buffer circuit.

FIG. 11 is a plurality of diagrams each showing an application of the contact structure according to the embodiment. To be more specific, FIG. 11A is a diagram showing an equivalent circuit of a buffer circuit provided typically at the output stage of a horizontal driving circuit as a circuit to which the contact structure according to the embodiment can be applied. FIG. 11B is a diagram showing typical connection patterns of the buffer circuit.

In the diagrams of FIG. 11, CMOS inverters INV1, INV2 and INV3 are connected to each other in series at three stages to form a buffer circuit.

The CMOS inverter INV1 employs a PMOS (P-channel MOS) transistor PT1 and an NMOS (N-channel MOS) transistor NT1. The source electrode of the PMOS transistor PT1 is connected to a power-supply electric potential VDD, the source electrode of the NMOS transistor NT1 is connected to a reference electric potential VSS whereas the drain electrode of the PMOS transistor PT1 is connected to the drain electrode of the NMOS transistor NT1. The connection point between the drain electrode of the PMOS transistor PT1 and the drain electrode of the NMOS transistor NT1 serves as the output node ND1 of the CMOS inverter INV1. The gate electrode of the PMOS transistor PT1 and the gate electrode of the NMOS transistor NT1 are both connected to a signal input line. The reference electric potential VSS is typically the electric potential of the ground.

By the same token, the CMOS inverter INV2 employs a PMOS transistor PT2 and an NMOS transistor NT2. The source electrode of the PMOS transistor PT2 is connected to the power-supply electric potential VDD, the source electrode of the NMOS transistor NT2 is connected to the reference electric potential VSS whereas the drain electrode of the PMOS transistor PT2 is connected to the drain electrode of the NMOS transistor NT2. The connection point between the drain electrode of the PMOS transistor PT2 and the drain electrode of the NMOS transistor NT2 serves as the output node ND2 of the CMOS inverter INV2. The gate electrode of the PMOS transistor PT2 and the gate electrode of the NMOS transistor NT2 are both connected to the output node ND1 of the CMOS inverter INV1.

In the same way, the CMOS inverter INV3 employs a PMOS transistor PT3 and an NMOS transistor NT3. The source electrode of the PMOS transistor PT3 is connected to the power-supply electric potential VDD, the source electrode of the NMOS transistor NT3 is connected to the reference electric potential VSS whereas the drain electrode of the PMOS transistor PT3 is connected to the drain electrode of the NMOS transistor NT3. The connection point between the drain electrode of the PMOS transistor PT3 and the drain electrode of the NMOS transistor NT3 serves as the output node ND3 of the CMOS inverter INV3. The gate electrode of the PMOS transistor PT3 and the gate electrode of the NMOS transistor NT3 are both connected to the output node ND2 of the CMOS inverter INV2.

In the typical application shown in FIG. 11B, the output node ND1 of the CMOS inverter INV1 (that is, the drain electrodes of the PMOS transistor PT1 and the NMOS transistor NT1) is connected to the gate electrodes of the PMOS transistor PT2 and the NMOS transistor NT2, which are employed in the CMOS inverter INV2, in accordance with an ordinary contact configuration not adopting the contact structure according to the embodiment.

On the other hand, the output node ND2 of the CMOS inverter INV2 (that is, a node connecting the drain electrodes of the PMOS transistor PT2 and the NMOS transistor NT2 to each other) is connected to the gate electrodes of the PMOS transistor PT3 and the NMOS transistor NT3, which are employed in the CMOS inverter INV3, in accordance with the contact structure according to the embodiment.

As also shown in FIG. 11B, in the ordinary contact configuration not adopting the contact structure according to the embodiment, three contact areas are desired. In the contact structure according to the embodiment, on the other hand, merely one contact area is desired.

Figure 12:
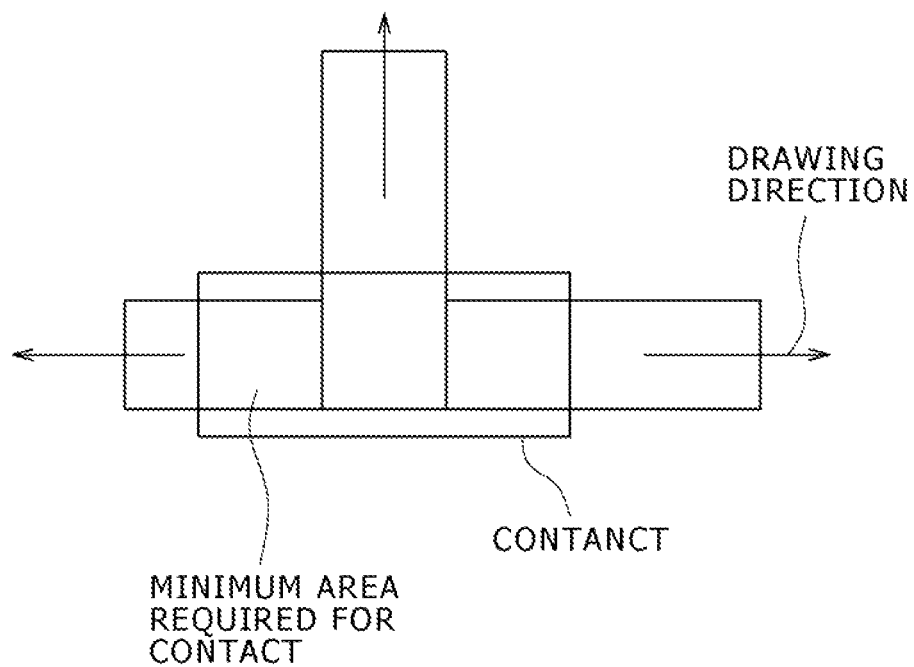
FIG. 12 is a diagram showing a preferred typical layout of a contact structure according to an embodiment.

It is to be noted that, the contact structure according to the embodiment can have a layout cutting across the edge of the contact in the drawing direction of each electrode if a minimum contact area of every wiring layer (or conductive layer) is assured as shown in FIG. 12.

The following description explains a method for manufacturing a semiconductor device having the contact structure according to the embodiment.

Basically, a method for manufacturing a semiconductor device including n (where notation n denotes a positive integer at least equal to three) conductive layers created as stacked layers on a substrate and connected to each other through a contact pattern includes:

a process of piling up (n−1) conductive layers of the n conductive layers on the substrate by introducing an interlayer insulation film between any adjacent two of the conductive layers;

a process of continuously etching each of the interlayer insulation films in order to remove portions of each of the interlayer insulation films so as to form the contact pattern including the (n−1) conductive layers; and a process of creating the nth conductive layer in accordance with a pattern covering at least a portion of each of the (n−1) conductive layers included in the contact pattern.

In the case of the typical semiconductor devices shown in FIGS. 6 and 7, the (n−1) conductive layers are the conductive layers 202 and 203. In the case of the typical semiconductor device shown in FIG. 9, on the other hand, the (n−1) conductive layers are the conductive layers 202, 203 and 205.

For example, a method for manufacturing the typical semiconductor device shown in FIG. 6 or 7 includes: a process of creating a first conductive layer 202 on a substrate 201; a process of creating a first interlayer insulation film 206 on the first conductive layer 202; a process of creating a second conductive layer 203 on the first interlayer insulation film 206; a process of creating a second interlayer insulation film 207 on the second conductive layer 203; a process of continuously etching the first and second interlayer insulation films 206 and 207 in order to remove portions of the first and second insulation films 206 and 207 so as to form a contact pattern CPTN including the first and pair second conductive layers 202 and 203; and a process of creating a third conductive layer 204 in accordance with a pattern covering at least a portion of each of the first and pair second conductive layers 202 and 203 included in the contact pattern CPTN.

The following description explains the method for manufacturing the typical semiconductor devices shown in FIGS. 6 and 7 more concretely.

Figure 14A:
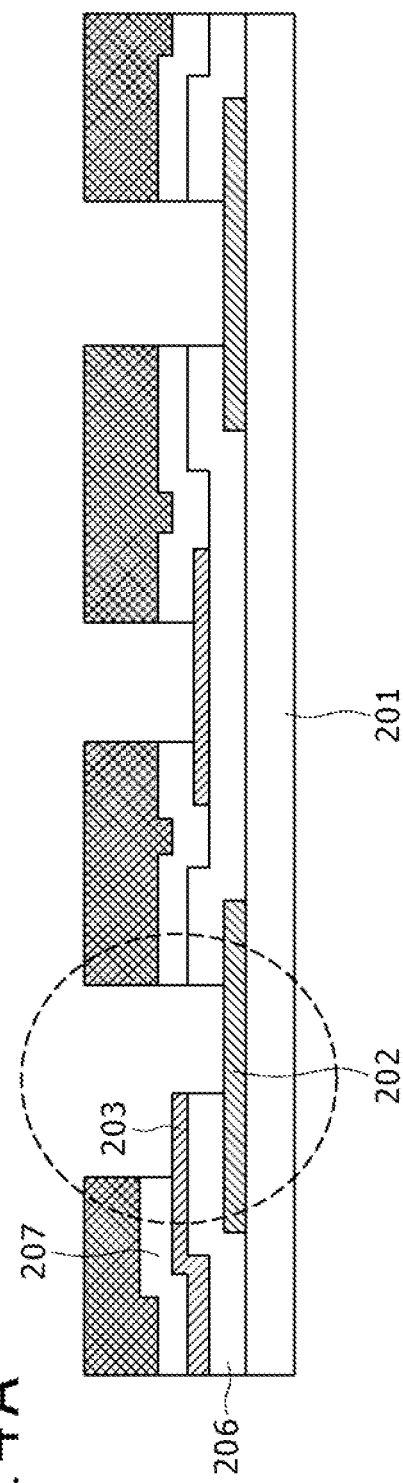
FIG. 14A is a diagram to be referred to in description of locations of the first and second conductive layers in a contact area.
Figure 14B:
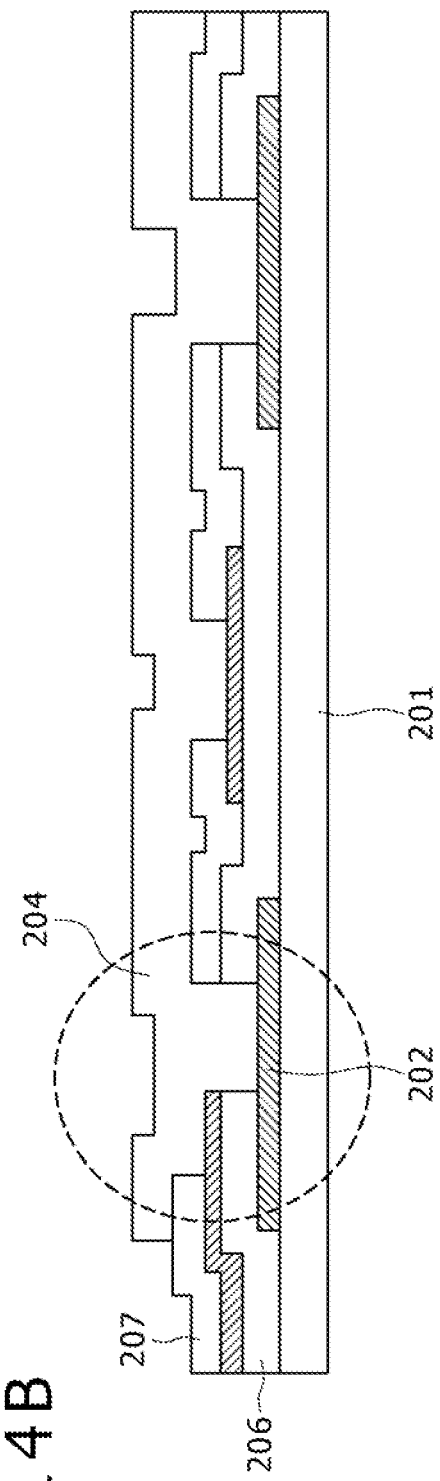
FIG. 14B is a diagram to be referred to in description of a process of creating a third conductive layer on the second interlayer insulation film.

FIGS. 13A to 13C as well as FIGS. 14A and 14B are diagrams referred to in the description of the method for manufacturing the typical semiconductor devices shown in FIGS. 6 and 7.

As shown in FIG. 13A, a first conductive layer 202 with a thickness of 100 nm is created on a substrate 201 from a material such as Mo, Cr, Ta or W by making use of a sputtering process.

Then, photo resists not shown in FIG. 13 are created on the first conductive layer 202 at locations determined in advance. Subsequently, by making use of the photo resists as masks, portions of the first conductive layer 202 outside the locations determined in advance are etched in order to remove the portions and to leave the remaining portions as electrodes. Then, the photo resists are peeled off from the remaining portions of the first conductive layer 202 in order to leave the electrodes 202 as shown in FIG. 13A.

The etching process to remove the portions of the first conductive layer 202 is carried out by adoption of an RIE (Reactive Ion Etching) method making use of a fluorine-system gas such as SF6 and application of a power of 1 kW.

Next, as shown in FIG. 13B, a first interlayer insulation film 206 with a thickness of 100 nm is created from a material such as SiO2 on the remaining portions of the first conductive layer 202 by adoption of a P (plasma)-CVD method. Then, a semiconductor film such as an a-Si film with a thickness of 50 nm is created on the first interlayer insulation film 206 by adoption of the P-CVD method in a process to create the second conductive layer 203 described as follows.

In the case of a low-temperature polysilicon LCD or the like, an XeCl excimer laser is radiated to the a-Si film at an intensity of 300 mJ/cm$^2$ in order to create a p-Si film.

Then, in order to create a CMOS circuit not shown in the figure, phosphorous or boron is injected into the p-Si film by adoption of an ion-doping method. Later on, at a temperature of 450 degrees Celsius, anneal processing is carried out in order to create a low resistive p-Si film. The low resistive p-Si film is used as the second conductive layer 203 to serve as electrodes.

Then, photo resists not shown in FIG. 13 are created on the second conductive layer 203 at locations determined in advance. Subsequently, by making use of the photo resists as masks, portions of the second conductive layer 203 outside the locations determined in advance are etched in order to remove the portions and to leave the remaining portions as electrodes. Then, the photo resists are peeled off from the remaining portions the second conductive layer 203 in order to leave the electrodes 203 as shown in FIG. 13C. The etching process to remove the portions of the second conductive layer 203 is carried out by adoption of the RIE method making use of a fluorine-system gas such as SF6 and application of a power of 1 kW.

Next, as shown in FIG. 13C, a second interlayer insulation film 207 with a thickness of 400 nm is created from a material such as SiNx on the remaining portions of the second conductive layer 203 by adoption of the P-CVD method.

The photo resists for contact creation on the second conductive layer 203 are created at the locations determined in advance so that the second conductive layer 203 is placed at a portion inside the same contact indicated by a dashed-line circle in the contact creation area according to the embodiment as the first conductive layer 202 whereas the first conductive layer 202 is placed at a portion not occupied by the second conductive layer 203 as shown in FIG. 14A.

Then, portions of the first and second interlayer insulation films 206 and 207 are etched in order to remove the portions. The etching process to remove the portions of the first and second interlayer insulation films 206 and 207 is carried out by adoption of the RIE method making use of a C4F8-system gas and application of a power of 3 kW. In this case, the etching process to remove the portions of the first and second interlayer insulation films 206 and 207 makes use of a gas that does not etch the first conductive layer 202 and the second conductive layer 203 each of which will serve as an electrode.

Then, as shown in FIG. 14B, a third conductive layer 204 with a thickness of 300 nm is created from a material such as Al, W, Mo, Cr or Cu by making use of the sputtering process after the photo resists for contact creation have been peeled off from the remaining portions the second conductive layer 203.

Subsequently, a photo resist having a shape determined in advance is created on the third conductive layer 204 at a location determined in advance. Subsequently, by making use the photo resist as a mask, a portion of the third conductive layer 204 outside the location determined in advance is etched in order to remove the portion. Then, the photo resist is peeled off from the third conductive layer 204. The etching process to remove the portion of the third conductive layer 204 is carried out by adoption of the RIE method making use of a chlorine-system gas such as BC13 and application of a power of 1 kW.

In addition, it is desirable to adopt an etching method having anisotropy as a method for etching an interlayer insulation film. In particular, it is specially desirable to adopt a dry etching method for forming portions of an interlayer insulation film. This is because, if an etching method having isotropy is adopted, an interlayer insulation film under an electrode beneath the interlayer insulation film being formed is also etched off in the horizontal direction, resulting in a defect such as a broken step. An example of the etching method having isotropy is a wet etching method.

On the top of that, in an etching process, it is desirable to select a gas that does not etch materials each used for making an electrode.

As described above, a semiconductor device 200 according to the embodiment is basically created by laminating n (where notation n denotes a positive integer at least equal to three) conductive layers as stacked layers on a substrate 201 and connecting the n conductive layers to each other through a contact pattern CPTN. In the case of the typical semiconductor devices shown in FIGS. 6 and 7, n=3 and, thus, the n conductive layers are the conductive layers 202, 203 and 204. A main contact area in which the contact pattern CPTN is created includes 2 (=n−1=3−1) connection areas 211 and 212 for connecting the (n−1) conductive layers 202 and 203 excluding the conductive layer 204 serving as the nth conductive layer to the nth conductive layer. In the case of the typical semiconductor device shown in FIG. 9, on the other hand, n=4 and the n conductive layers are the conductive layers 202, 203, 204 and 205. In this case, the main contact area in which the contact pattern CPTN is created includes 3 (=n−1=4−1) connection areas 211 to 213 for connecting the (n−1) conductive layers 202, 203 and 205 excluding the conductive layer 204 serving as the nth conductive layer to the nth conductive layer.

Every two adjacent conductive layers of the (n−1) conductive layers conceptually form a conductive-layer pair consisting of these two adjacent conductive layers which are referred to respectively as the pair first and second conductive layers of the conductive-layer pair. Every pair second conductive layer provided at a location geometrically displayed away from a pair first conductive layer pertaining to the same conductive-layer pair as the pair second conductive layer in the stacking direction of a lamination process to pile up the (n−1) conductive layers on the substrate 201 is created so that the end part of the pair second conductive layer faces a portion of the edge of the contact pattern CPTN, and the (n−1) conductive layers are connected electrically to each other by the nth conductive layer. The stacking direction of a lamination process to pile up the (n−1) conductive layers on the substrate 201 is a direction perpendicular to the main surface of the substrate 201. The nth conductive layer is created, filling up a contact hole used as the contact pattern CPTN.

In other words, in the semiconductor device 200 according to the embodiment, a contact hole 220 is created as the contact pattern CPTN. Any two conductive layers included in the n conductive layers as two conductive layers stacked consecutively conceptually form a conductive-layer pair. In every conductive-layer pair, the conductive layer provided at a location geometrically displaced in a direction opposite to the stacking direction of a lamination process to pile up the conductive layers on the substrate 201 is referred to as a pair first conductive layer of the conductive-layer pair whereas the conductive layer provided at a location geometrically displaced in the stacking direction of the lamination process is referred to as a pair second conductive layer of the conductive-layer pair. A main contact area in which the contact hole 220 is created includes (n−2) sub-contact areas SCNT each used for connecting the pair first conductive layer to the pair second conductive layer pertaining to the same conductive-layer pair as the pair first conductive layer. That is to say, there are as many sub-contact areas SCNT and as conductive-layer pairs. The contact hole 220 described above includes a first contact hole 221 created in a contact area ARCNT201 of the main contact area as a contact hole having a diameter stretched over an exposed area of each of (n−1) conductive layers of the n conductive layers excluding the outermost conductive layer serving as the nth conductive layer of the n conductive layers. The contact hole 220 also includes (n−2) second contact holes 222 each created in any individual one of the sub-contact areas SCNT included in the main contact area as a contact hole connected to the first contact hole and extended to the pair first conductive layer of a conductive-layer pair associated with the individual sub-contact area SCNT. That is to say, there are as many contact holes 222 as sub-contact areas SCNT and as conductive-layer pairs. In each individual one of the sub-contact areas SCNT, the pair second conductive layer of a conductive-layer pair associated with the individual sub-contact area SCNT is created so that the upper surface of the pair second conductive layer faces the first contact hole 221 whereas the end part of the pair second conductive layer faces one of the second contact holes 222 which is created in the individual sub-contact area SCNT. The outermost conductive layer serving as the nth conductive layer of the n conductive layers is created, starting from the pair first conductive layers each located inside one of the second contact holes each created in one of the sub-contact areas and ending at the outermost surface of the semiconductor device, and is connected to the end parts of the pair second conductive layers as well as the upper surfaces of the pair second conductive layers in the first contact hole.

Thus, in accordance with the semiconductor device implemented by the embodiment, it is possible to reduce the size of an area desired for connecting three or more wiring layers. That is to say, the semiconductor device according to the embodiment contributes to high integration and reduction of the area allocated to peripheral parts. In particular, the semiconductor device according to the embodiment demonstrates an extraordinary effect for a case in which a large number of wires are used.

An embodiment has been explained by applying the semiconductor device to an active-matrix liquid-crystal display apparatus employing driving circuits built on a substrate. It is to be noted, however, that the scope of the embodiment is by no means limited to the embodiment. That is to say, the embodiment can also be applied to other active-matrix display apparatus including an EL (electro luminescence) display apparatus making use or an EL device as an electro-optical device in every pixel.

In addition, an embodiment can also be applied to an input/output circuit which has similar driving circuits provided on a substrate and employs photo sensors, bio cells, temperature sensors or their combination.

Figure 15:
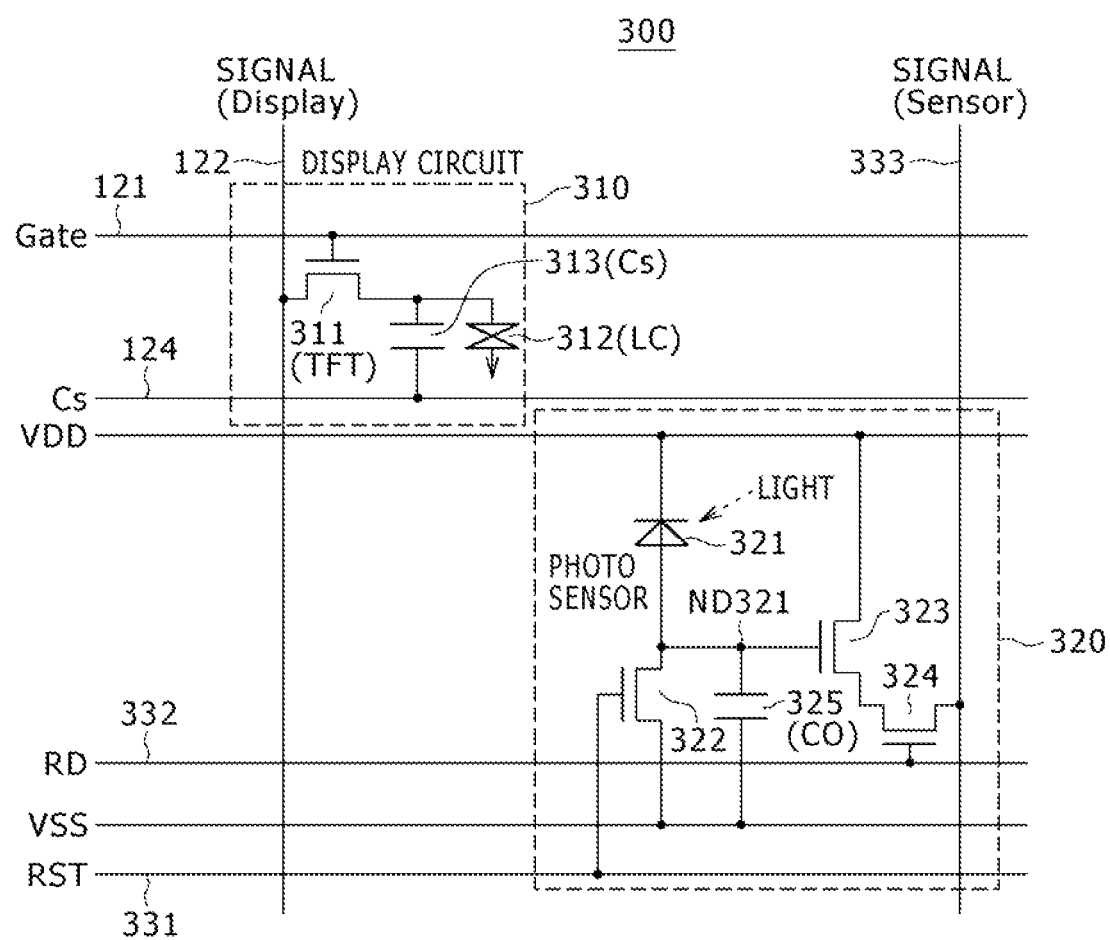
FIG. 15 is a circuit diagram showing typical configurations of a display circuit and a light receiving cell according to another embodiment.

For example, an embodiment can be applied to a display apparatus employing a matrix of display units 300 each consisting of a display circuit 310 and a light receiving cell 320 as shown in FIG. 15. The display circuit 310 corresponds to the unit pixel 123 employed in the effective display section 12 shown in FIG. 5. Driving circuits and a signal processing circuit employed in each light receiving cell 320 are integrated on a panel to form a single unit.

FIG. 15 is a circuit diagram showing a basic typical configuration of the light receiving cell 320 according to another embodiment and a basic typical configuration of the display circuit 310 provided at a location adjacent to the light receiving cell 320.

The light receiving cell 320 employs a light receiving device 321, a reset TFT (Thin Film Transistor) 322, an amplification TFT 323, a select (read) TFT 324, a capacitor functioning as a received-light signal accumulating capacitor 325 and a node ND321. The light receiving device 321 is typically a TFT or a diode. The reset TFT 322, the amplification TFT 323, the select (read) TFT 324, the received-light signal accumulating capacitor 325 and the node ND321 form a read circuit of the light receiving cell 320.

The light receiving device 321 is connected between a power-supply electric potential VDD and the node ND321. The reset TFT 322 is typically an n-channel transistor. The source electrode of the reset TFT 322 is connected to a reference electric potential VSS such as the electric potential of the ground GND. The drain electrode of the reset TFT 322 is connected to the node ND321. The gate electrode of the reset TFT 322 is connected to a light receiving cell control line 331 which is linked to a row on which the light receiving cell 320 is provided.

The gate electrode of the amplification TFT 323 is connected to the node ND321 whereas the drain electrode of the amplification TFT 323 is connected to the power-supply electric potential VDD. The source electrode of the amplification TFT 323 is connected to the drain electrode of the select TFT 324. The gate electrode of the select TFT 324 is connected to a second received-light control line 332. The source electrode of the select TFT 324 is connected to a received-light signal line 333 for a column on which the light receiving cell 320 is provided.

The amplification TFT 323 and the select TFT 324 form the so-called source follower. Thus, a current source is connected to the received-light signal line 333. In this embodiment, the current source is constructed typically in a received-light signal processing circuit.

The received-light signal accumulation capacitor 325 is connected between the node ND321 and the reference electric potential VSS.

The received-light signal processing circuit not shown in the figure is also integrated in the single unit cited above on a panel. In this case, the contact structure according to the embodiment described before can be applied to the received-light signal processing circuit.

The active-matrix display apparatus represented by the active-matrix display liquid-crystal apparatus is well used as the display unit of OA equipment such as a personal computer and a word processor as well as the display unit of a TV receiver. In addition, such an active-matrix display apparatus is also well used as the display unit of a portable terminal enclosed in a case with its size made smaller and smaller or made more compact from time to time. Examples of such a portable terminal are a hand-held phone and a PDA.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention is claimed as follows:

1. A semiconductor device comprising:
a substrate;
n conductive layers stacked on the substrate and connected to each other through a contact pattern formed in a contact hole, where n is at least four and the conductive layers include
at least two conductive-layer pairs, a first conductive-layer pair including a first conductive layer and a second conductive layer that partially overlaps and is offset in a planar direction of the substrate from the first conductive layer, and a second conductive-layer pair including the second conductive layer and a third conductive layer that partially overlaps and is offset in a planar direction of the substrate from the second conductive layer, at least a portion of the second conductive layer being positioned further away from the substrate than the first conductive layer, and
an outermost conductive layer serving as an nth conductive layer of said n conductive layers; and
(n−1) interlayer insulation films, at least a portion of each (n−1) interlayer insulation film is formed between two adjacent conductive layers of the n conductive layers, an outermost interlayer insulation film serving as the (n−1) th interlayer insulation layer; and
wherein the outermost conductive layer is formed over a portion of the first conductive layer, over a portion of the second conductive layer, and over portions of the outermost interlayer insulation film, and is formed in contact with only one outermost side edge portion of the second conductive layer that is positioned over the first conductive layer,
wherein the first conductive layer and the second conductive layer are connected electrically to each other by the nth conductive layer,
wherein a portion of an innermost interlayer insulation film is formed on the first conductive layer, the second conductive layer is formed directly on the innermost interlayer insulation film, and
wherein the contact hole includes a first sub-contact hole located between the innermost interlayer insulation film in plan view, and a second sub-contact hole located in plan view between the second conductive layer and a second interlayer insulation film that is formed directly on the innermost insulation film, the first and second sub-contact holes being filled with the outermost conductive layer, and the second sub-contact hole being recessed beneath an upper surface of the second conductive layer and having a diameter smaller than a diameter of the contact hole, at least a portion of the second sub-contact hole being located outside of an area occupied by the first sub-contact hole in plan view.

2. The semiconductor device according to claim 1, wherein a thickness of the interlayer insulation films are made smaller than a thickness of the nth conductive layer.

3. The semiconductor device according to claim 1, wherein the second and third conductive layers extend away from the contact hole in different directions.

4. The semiconductor device according to claim 1, wherein the first conductive layer is formed directly on the substrate.

5. The semiconductor device according to claim 1, wherein each of the second through nth conductive layers is formed in a step configuration in a thickness direction of the semiconductor device.

* * * * *